(12) United States Patent
Brown et al.

(10) Patent No.: US 7,494,907 B2
(45) Date of Patent: Feb. 24, 2009

(54) NANOSCALE ELECTRONIC DEVICES AND FABRICATION METHODS

(75) Inventors: Simon Anthony Brown, Christchurch (NZ); Juern Schmelzer, Rostock (DE)

(73) Assignee: Nanocluster Devices Limited, Christchurch (NZ)

( * ) Notice: Subject to any disclaimer, the term of this patent is extended or adjusted under 35 U.S.C. 154(b) by 228 days.

(21) Appl. No.: 10/487,191

(22) PCT Filed: Aug. 20, 2002

(86) PCT No.: PCT/NZ02/00160

§ 371 (c)(1), (2), (4) Date: Aug. 16, 2004

(87) PCT Pub. No.: WO03/016209

PCT Pub. Date: Feb. 27, 2003

(65) Prior Publication Data

US 2005/0064618 A1    Mar. 24, 2005

(30) Foreign Application Priority Data

Aug. 20, 2001 (NZ) ..................... 513637

(51) Int. Cl.
H01L 21/44 (2006.01)

(52) U.S. Cl. ............... 438/584; 438/597; 257/E21.001; 977/720; 977/773

(58) Field of Classification Search ................ 438/584, 438/597; 977/720, 773
See application file for complete search history.

(56) References Cited

U.S. PATENT DOCUMENTS

| | | | |
|---|---|---|---|
| 6,294,401 B1 * | 9/2001 | Jacobson et al. ............. 438/99 |
| 6,312,768 B1 * | 11/2001 | Rode et al. ................. 427/596 |
| 6,586,787 B1 * | 7/2003 | Shih et al. ................. 257/288 |
| 6,723,606 B2 * | 4/2004 | Flagan et al. .............. 438/264 |
| 6,815,218 B1 * | 11/2004 | Jacobson et al. .............. 438/1 |
| 2003/0048619 A1 * | 3/2003 | Kaler et al. ................. 361/760 |
| 2003/0081305 A1 * | 5/2003 | Chung et al. ................ 359/296 |
| 2004/0038556 A1 * | 2/2004 | French et al. .............. 438/800 |
| 2004/0129570 A1 * | 7/2004 | Talin et al. ................. 205/109 |
| 2005/0200272 A1 * | 9/2005 | Shimoyama et al. ........ 313/503 |
| 2006/0063296 A1 * | 3/2006 | Park et al. ..................... 438/93 |

OTHER PUBLICATIONS

International Search Report (International Application No. PCT/NZ02/00160, International Filing Date: Aug. 20, 2002.

Chen, W., et al., "Coulomb blockade at 77 K in nanoscale metallic islands in a lateral nanostructure," Appl. Phys. Lett. 66(24):3383-3384, 1995.

(Continued)

Primary Examiner—Savitri Mulpuri
(74) Attorney, Agent, or Firm—Dann, Dorfman, Herrell and Skillman, P.C.

(57) ABSTRACT

The invention relates to a method of forming a conducting nanowire between two contacts on a substrate surface wherein a plurality of nanoparticles is deposited on the substrate in the region between the contacts, and the single nanowire running substantially between the two contacts is formed by either by monitoring the conduction between the contacts and ceasing deposition at the onset of conduction, and/or modifying the substrate to achieve, or taking advantage of pre-existing topographical features which will cause the nanoparticles to form the nanowire. The resultant conducting nanowires are also claimed as well as devices incorporating such nanowires.

53 Claims, 29 Drawing Sheets

OTHER PUBLICATIONS

Klein, D.K., et al., "An approach to electrical studies of single nanocrystals," Appl. Phys. Lett., 68(18):2574-2576, 1996.

Bezryadin, A., et al., "Nanofabricaion of electrodes with sub-5 nm spacing for transport experiments on single molecules and metal clusters," J. Vac. Sci. Technol. B, 15(4):793-799, 1997.

Bezryadin, A., et al., "Electrostatic trapping of single conducting nanoparticles between nanoelectrodes," Appl. Phys. Lett. 71(9):1273-1275, 1997.

Tans, S.J., et al., "Room-temperature transistor based on a single carbon nanotube," Nature, 393:49-51, 1998.

Collins, P.G., et al., "Engineering Carbon Nanotubes and Nanotube Circuits Using Electrical Breakdown," Science, 292:706-709, 2001.

Rochefort, A., et al., "Switching behavior of semiconducting carbon nanotubes under an external electric field," Appl. Phys. Lett., 78(17):2521-2523, 2001.

Rodrigues, V., et al., "Signature of Atomic Structure in the Quantum Conductance of Gold Nanowires," Phys. Rev. Lett., 85(19):4124-4127, 2000.

Morpurgo, A.F., et al., "Controlled fabrication of metallic electrodes with atomic separation," Appl. Phys. Lett., 74(14):2084-2086, 1999.

Li, C.Z., et al., "Molecular detection based on conductance quantization of nanowires," Appl. Phys. Lett., 76(10):1333-1335, 2000.

Palmer, R., "Welcome to Clusterworld," New Scientist, Feb. 22, 1997, 4 pages.

Goldby, I.M., et al., "Gas condensation source for production and deposition of size-selected metal clusters," Rev. Sci. Instrum., 68(9):3327-3334, 1997.

Tada, T., et al., "Fabrication of 10-nm Si pillars with self-formed etching masks," MicroElectronic Engineering, 35:293-296, 1997.

Tada, T., et al., "Spontaneous production of 10-nm Si structures by plasma etching using self-formed masks," Appl. Phys. Lett., 70(19):2538-2540, 1997.

Liu, J., et al., "Microfabrication of nanoscale cluster chains on a pattered Si surface," Appl. Phys. Lett., 73(14):2030-2032, 1998.

Goldby, I.M., et al., "Diffusion and aggregation of size-selected silver clusters on a graphite surface," Appl. Phys. Lett., 69(19):2819-2821, 1996.

Francis, G.M., et al., "Diffusion controlled growth of metallic nanoclusters at selected surface sites," J. Appl. Phys., 79(6):2942-2947, 1996.

Seeger, K., et al., "Fabrication of silicon cones and pillars using rough metal films as plasma etching masks," Appl. Phys. Lett., 74(11):1627-1629, 1999.

Carroll, S.J., et al., "Trapping of size-selected Ag clusters at surface steps," Appl. Phys. Lett., 72(3):305-307, 1998.

Chen, W., et al., "Fabrication of sub-10nm structures by lift-off and by etching after electron-beam exposure of poly(methylmethacrylate) resist on solid substrates," J. Vac. Sci. Technol. B, 11(6):2519-2523, 1993.

Hori, M., et al., "Sub-5 nm gold dot formation using retarding-field single ion deposition," Appl. Phys. Lett., 73(22):3223-3225, 1998.

Gurevich, L., et al., "Scanning gate spectroscopy on nanoclusters," Appl. Phys. Lett., 76(3):384-386, 2000.

Park, J., et al., "Coulomb blockade and the Kondo effect in single-atom transistors," Nature, 417:722-725, 2002.

Liang, W., et al., "Kondo resonance in a single-molecule transistor," Nature, 417:425-728, 2002.

Yamamuro, S., et al., "Size-Dependent Nonuniversal Conductivity in Nanometer-Size Co Cluster Assemblies," Journal of Physical Society of Japan, 68(1):28-31, 1999.

Laibowitz, R.B., et al., "Cluster-size distribution in Al-$Al_2O_3$ films near the metal-insulator transition," Physical Review B, 25(4):2965-2967, 1982.

Voss, R.F., et al., "Fractal (Scaling) Clusters in Thin Gold Films near the Percolation Threshold," Physical Review Letters, 49(19):1441-1444, 1982.

Kapitulnik, A., et al., "Percolation Characteristics in Discontinuous Thin Films of Pb," Physical Review Letters, 49(19):1444-1448, 1982.

Jensen, P., et al., "Direct observation of the infinite percolation cluster in thin films: Evidence for a double percolation process," Physical Review B 47(9):5008-5012, 1993.

Melinon, P., et al., "Comparison of molecular and cluster deposition: Evidence of different percolation processes," Physical Review B, 44(22):12562-12564, 1991.

De Heer, W.A., "The physics of simple metal clusters: experimental aspects and simple models," Reviews of Modern Physics, 65(3):611-624, 1993.

Stauffer, D., "Introduction to Percolation Theory," Taylor & Francis, London 1985, table of contents, preface, and pp. 1-100.

Chopra, H.D., et al., "Ballistic magnetoresistance over 3000% in Ni nanocontacts at room temperature," Physical Review B, 66:020403-1-020402-3, 2002.

Hiramoto, T., et al., "Fabrication of Si Nanostructures for Single Electron Device Applications by Anisotropic Etching," Jpn. J. Appl. Phys., 35:6664-6667, 1996.

Von Issendorff, B., et al., "A new high transmission infinite range mass selector for cluster an nanoparticle beams," Review of Scientific Instruments, 70(12):4497-4501, 1999.

Hall, B., "An installation for the study of unsupported ultrafine particles by electron diffraction, with application to silver: observation of multiply twinned particle structures," 1991, pp. 33-45.

Stanley, H.E., "Scaling, universality, and renormalization: Three pillars of modern critical phenomena," Rev. Mod. Phys. 71(2):S358-S366, 1999.

Back, C.H., et al., "Experimental confirmation of universality for a phase transition in two dimensions," Nature, 378:597-600, 1995.

Monetti, R.A., et al., "Critical behavior of the site percolation model on the square lattice in a L×M geometry," Z. Phys. B-Condensed Matter, 82:129-134, 1991.

Fuchs, G., et al., "Low-energy Bi cluster beam deposition," J. Phys. D, 26:1114 (1993), 3 pages.

Zhang, et al., "Bismuth quantum-wire arrays fabricated by a vacuum melting and pressure injection process," Journal of Materials Research 13 (7), 1745-1748 (Jul. 1998).

Jorritsma, J., et al., "Fabrication of large arrays of metallic nanowires on V-grooved substrates" Applied Physics Letters 67 (10), 1489-1491 (Sep. 4, 1995).

Jorritsma, J. and J. A. Mydosh, "Magnetic Properties of $Au_{1-x}Fe_x$ Nanowires" IEEE Transactions on Magnetics 34 (4), 994-996 (Jul. 1998).

Himpsel, F. J., et al., "Self-assembly on one-dimensional nanostructures at silicon surfaces" Solid State Communications 117, 149-157, 2001.

Parker, A. J., et al., "Deposition of passivated gold nanoclusters onto prepatterned substrates" Applied Physics Letters 74 (19), 2833-2835 (May 10, 1999).

Zach, Michael P., et al., "Molybdenum Nanowires by Electrodeposition" Science 290, 2120-2123 (Dec. 15, 2000).

Favier, Frederic, et al., "Hydrogen Sensors and Switches from Electrodeposited Palladium Mesowire Arrays" Science 293, 2227-2231 (Sep. 21, 2001).

Batzill, M., et. al., "Fabrication of periodic nanoscale Ag-wire arrays on vicinal $CaF_2$ surfaces" Nanotechnology 9, 20-29, 1998.

Eastham, D. A., et al., "Formation of ordered assemblies from deposited gold clusters" Nanotechnology 13, 51-54, 2002.

Bardotti, L., et. al., "Organizing nanoclusters on functionalized surfaces" Applied Surface Science 191, 205-210, 2002.

Ishikuro, Hiroki and toshiro Hiramoto, "Fabrication of Nano-Scale Point Contact Metal-Oxide-Semiconductor Field-Effect-Transistors Using Micrometer-Scale Design Rule" Jpn. J. Appl. Phys. 38 (Part 1, No. 1B), 396-398 (Jan. 1999).

Harbich, Wolfgang, "Deposition, Surface Modification and Scattering" Metal Clusters at Surfaces Structure, Quantum Properties, Physical Chemistry, Chapter 4 n Meiwes-Broer K-H (Ed.) 107-114-Springer: Berlin, 2000.

Haberland, Hellmut, "Molecular-dynamics simulation of thin-film growth by energic cluster impact" Physical Review B 51 (16), 11061-11067 (Apr. 15, 1995).

Moseler, Michael, et al., "The growth dynamics of energic cluster impact films" Computational Materials Science 10, 452-456, 1998.

Davies, J. T., and E. K. Rideal, "Interfacial Phenomena" Academic Press, New York—Physics of Surfaces pp. 40-45, 1961.

Gale, W. F. and T. C. Totemeier, "Smithells Metals Reference Book" Elsevier Butterworth Heinemann Eighth Edition, pp. 14-10 and 14-11, Jan. 2004.

Kittel, Charles, "Introduction to Solid State Physics" 7th Edition (Wiley: New York) 57, 1996.

Hartley, G. S., and R. T. Brunskill, "Reflection of Water Drops from Surfaces" pp. 214-223, 1958.

Schmelzer, J., et al., "Finite-Size Effects in the Conductivity of Cluster Assembled Nanostructures" Physical Review Letters 88 (22), 226802-1226802-4 (Jun. 3, 2002).

Hiramoto, T., et al, "Fabrication of Si Nanostructures for Single Electron Device Applications by Anisotropic Etching," Jpn., J. Appl. Phys., 35: 6664-6667, 1996.

Stanley, H. E., "Scaling, universality, and renormalization: Three pillars of modern critical phenomena," Rev. Mod. Phys. 71 (2): S358-S366, 1999.

Back, C. H., et al., "Experimental confirmation of universality for a phase transition in two dimensions," Nature, 378: 597-600, 1995.

Monetti, R. A., et al., "Critical behavior of the site percolation model on the square lattice in a L×M geometry," Z. Phys. B-Condensed Matter, 82: 129-134, 1991.

* cited by examiner

800μm ↔    40μm ↔

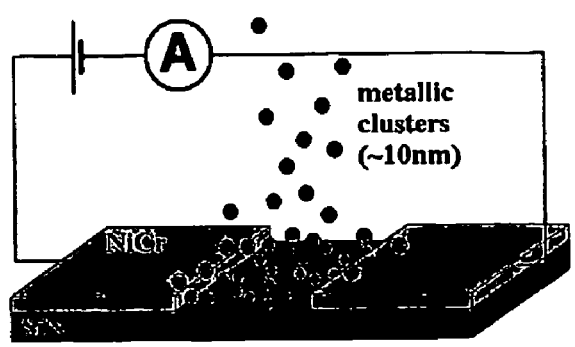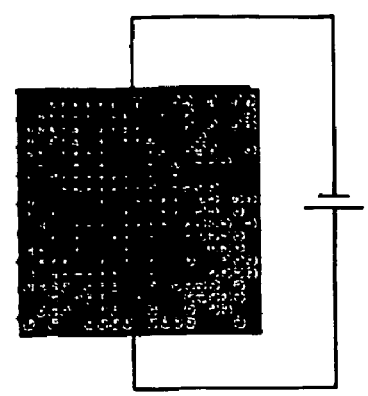
Figure 10
Figure 11

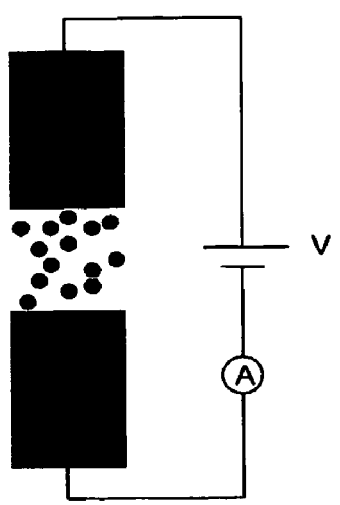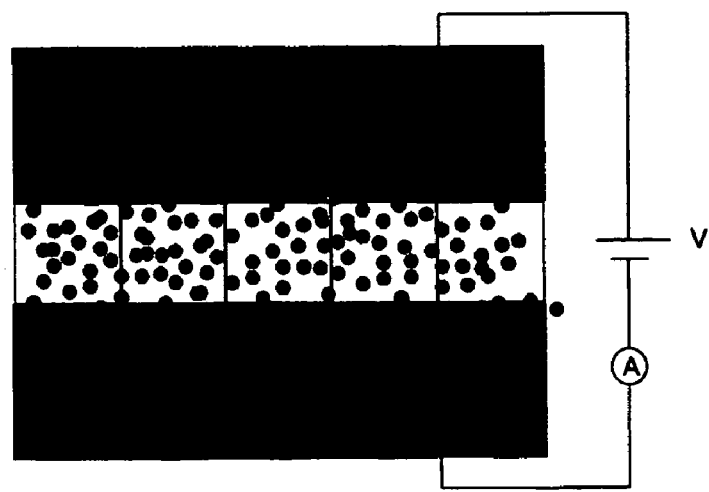
Figure 12                                    Figure 13

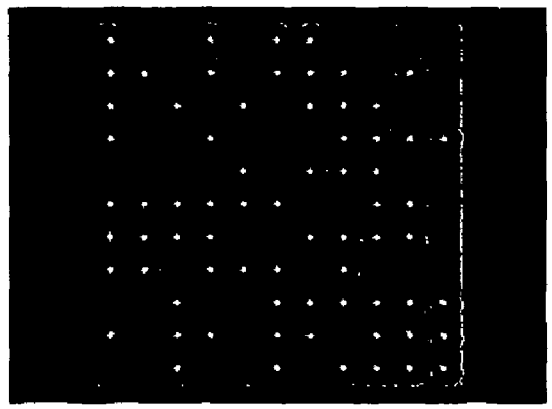 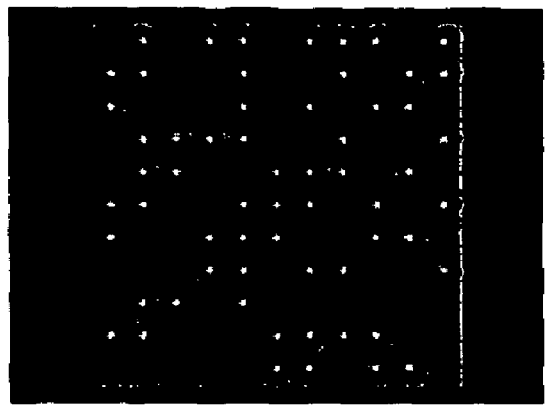
(a) (b)
Figure 17

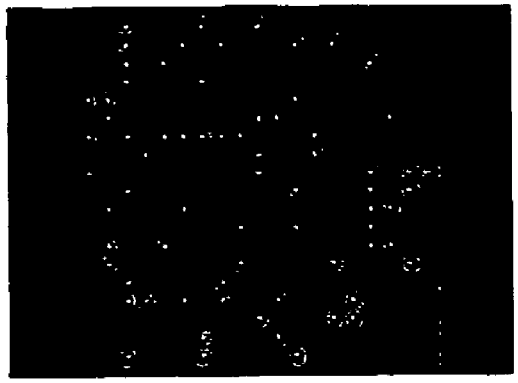
(a)
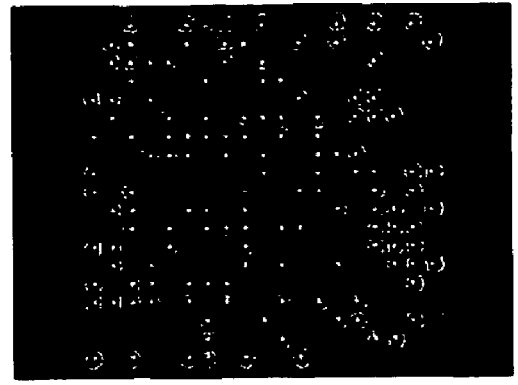
(b)
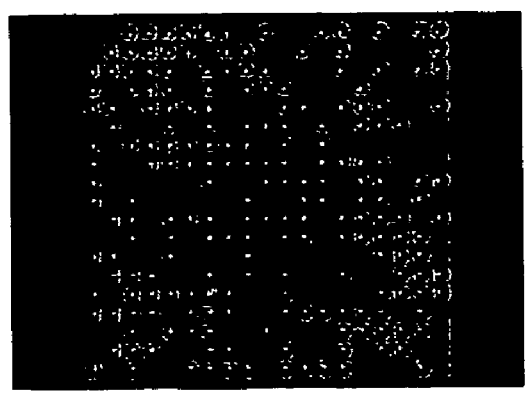
(c)
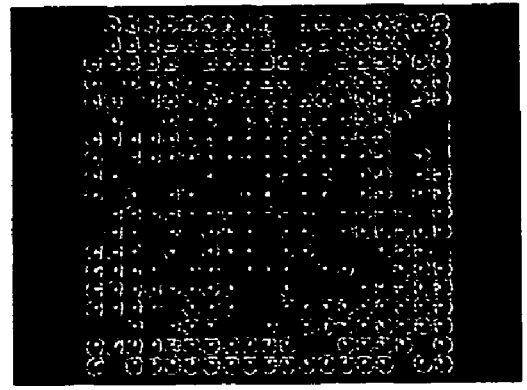
(d)
Figure 18

X 5.000 µm/div
Z 3000.000 nm/div

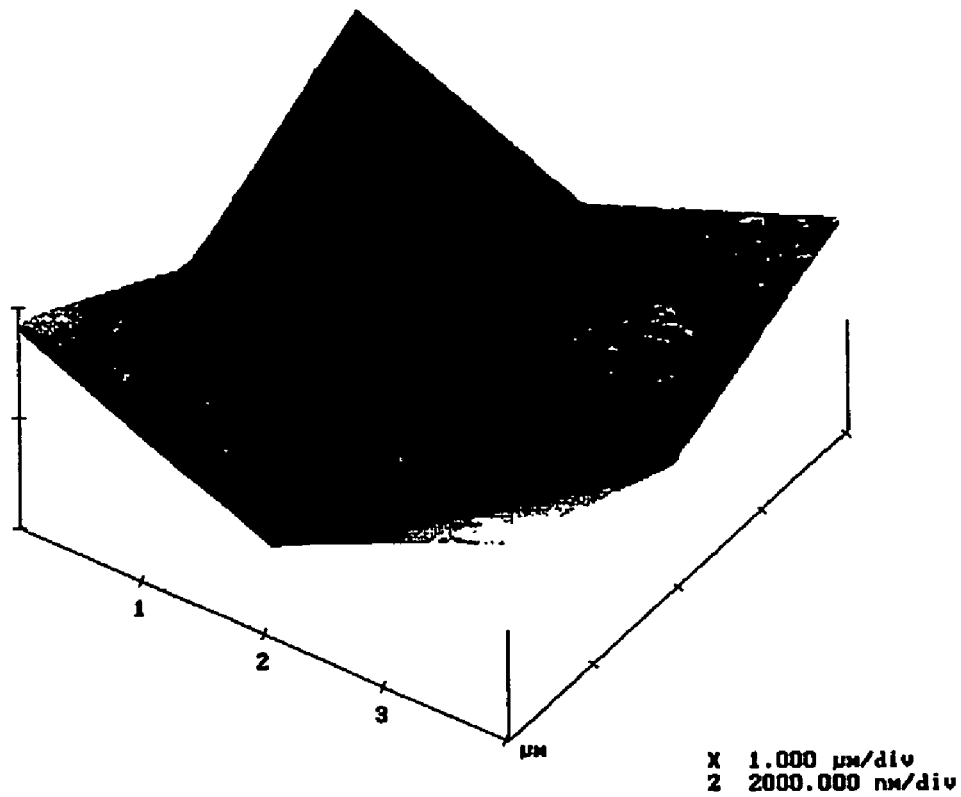
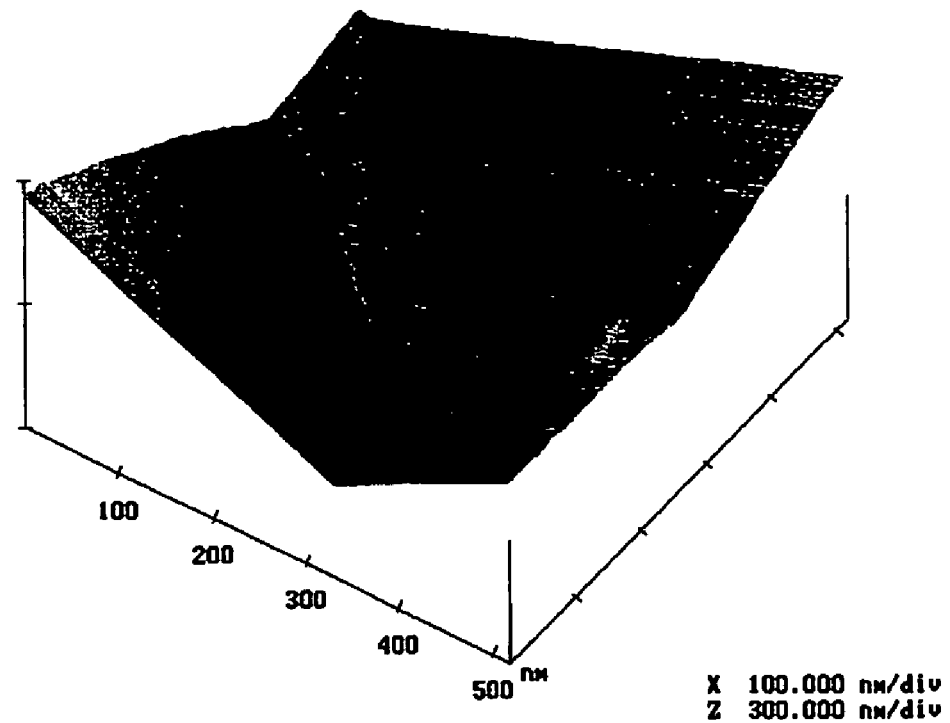
Figure 31

NANOSCALE ELECTRONIC DEVICES AND FABRICATION METHODS

FIELD OF THE INVENTION

The present invention relates to methods of preparing electrically conducting nanoscale wire-like structures for use in electronic devices and the devices formed by such methods. More particularly but not exclusively the invention relates to a method of preparing such structures by the assembly of conducting nanoparticles.

BACKGROUND TO THE INVENTION

Nanotechnology has been identified as a key technology for the 21st century. This technology is centred on an ability to fabricate electronic, optical and opto-electronic devices on the scale of a few billionths of a metre. In the future, such devices will underpin new computing and communications technologies and will be incorporated in a vast array of consumer goods.

There are many advantages of fabricating nanoscale devices. In the simplest case, such devices are much smaller than the current commercial devices (such as the transistors used in integrated circuits) and so provide opportunities for increased packing densities, lower power consumption and higher speeds. In addition, such small devices can have fundamentally different properties to those fabricated on a larger scale, and this then provides an opportunity for completely new device applications.

One of the challenges in this field is to develop nanostructured devices that will take advantage of the laws of quantum physics. Electrical devices with dimensions of ~100 nm that operate on quantum principles (such as single electron transistors and quantum wires) have generally been proven at only low temperatures (<–100° C.). The challenge now is to translate these same device concepts into structures with dimensions of only a few nanometres, since the full range of quantum effects and novel device functionalities could then be available at room temperature. Indeed, as discussed below, some prototype nanoscale devices have been fabricated that demonstrate such quantum effects at relatively high temperatures. However, as is also discussed below, there remain many challenges to overcome before such devices find commercial applications.

In general, there are two distinct approaches to fabricating nanoscale devices:

'top-down', and

'bottom up'.

In the 'top-down' approach, devices are created by a combination of lithography and etching. The resolution limits are determined by, for example, the wavelength of light used in the lithography process: lithography is a highly developed and reliable technology with high throughput but the current state of the art (using UV radiation) can achieve devices with dimensions ~10 nm only at great expense. Other lithography techniques (e.g. electron beam lithography) provide (in principle) higher resolution but with a much slower throughput.

The 'bottom-up' approach proposes the assembly of devices from nanoscale building blocks, thus immediately achieving nanoscale resolution, but the approach usually suffers from a range of other problems, including the difficulty, expense, and long time periods that can be required to assemble the building blocks. A key question is whether or not the top-down and bottom-up approaches can be combined to fabricate devices which take the best features of both approaches while circumventing the problems inherent to each approach.

An example of a prior art development which attempts to use this combination of approaches is the highly successful fabrication of transistors from carbon nanotubes [1]. Contacts are fabricated using lithography, and a nanoscale building block (in the form of a nanometre thick carbon nanotube) is used to provide the conducting path between the contacts. These transistors have been shown [2,3] to exhibit quantum transport effects and to have transistor characteristics comparable to those of Si— MOSFETs used in integrated circuits, and are therefore in principle usable in commercial applications. However, the difficulty in isolating and manipulating single nanotubes to form reproducible devices may prevent widespread commercial usage. Hence the development of new techniques for the formation of nanoscale wire structures between electrically conducting contacts is an important technological problem.

One simple approach to the formation of nanoscale wires is to stretch a larger wire until it is close to the breaking point with a diameter of just a few atoms (See e.g. Ref [4] and refs therein; similar effects can be achieved using scanning tunnelling microscopes). At this point the break junction can exhibit quantised conductance. This technique, while interesting, is not well suited to device formation since generally the technique is difficult to control, only a single wire can be fabricated at any time, and since multi-terminal devices cannot be easily achieved.

Another approach is to use a combination of lithographic and electrochemical techniques to achieve narrow wires and/or contacts with nanometre scale spacing [5]. Electrochemical deposition of Cu allows the observation of quantised conduction and a chemical sensor has been developed from these nanowires [6]. While these devices are promising it remains to be demonstrated that they can be fabricated sufficiently controllably or reproducibly for commercial applications, or that multi-terminal or other electronic devices can be fabricated using this method.

The proposal [7] that structures on the scale of a few nanometres could be formed using atomic clusters, which are nanoscale particles formed by simple evaporation techniques (see for example [8,9]), has already caught the imagination of a few groups internationally [10]. It has been shown that clusters can diffuse across a substrate [11] and then line up at certain surface features, thus generating cluster chain structures [12,13,14], although in these cases the chains are usually incomplete (have gaps) and such chains have so far not been connected to electrical contacts on non-conducting substrates. This approach is promising because the width of the wire is controlled by the size of the clusters, but the problem of positioning the clusters to form real devices on useful substrates has yet to be solved.

Devices formed using atomic clusters have been reported in Refs [8,15,16]: a network of clusters is formed by an ion beam deposition method [15] between two contacts which are defined using electron beam lithography. In this work clusters were formed by deposition of atomic vapour and not by deposition of preformed nanoparticles onto the substrate. The devices exhibit the Coulomb Blockade effect at T=77K [8] but apparently quantum effects are not visible at room temperature. In this work only clusters of AuPd and Au have been employed and, importantly, in these devices conduction through the cluster network was by tunnelling. No method was described which lead to the controllable formation of a conducting path, and only two terminal devices were described, and hence a device similar to the nanotube transistors described above was not formed.

A number of devices (see for example [17,18,19]) have been fabricated which incorporate single (or a very limited number) of nanoscale particles. These devices are potentially very powerful but, equally, are most likely to be subject to difficulties associated with the expense and long time periods that can be required to assemble the building blocks. Device to device reproducibility, and difficulty of positioning of the nanoparticles may be additional problems. Furthermore the preferred embodiment of these devices requires that the nanoparticle be isolated from the contacts by tunnel barriers whose properties are critical to the device performance, since tunnelling currents depend exponentially on the barrier thickness. In some cases the use of a scanning tunnelling microscope leads to a slow and not scalable fabrication process. Recent progress in this area has resulted in the first single electron transistors fabricated with a single atom as the island onto which tunnelling occurs [19]. While this is a significant achievement, and an element of self assembly in the fabrication is attractive, such devices are still far from commercial production and the methods used may not be viable for large scale production.

Wet chemical methods (see for example [17]) have also been shown to be useful with respect to fabrication of nanoscale devices and offer some promise as a method of overcoming the difficulties in positioning nanoparticles. While these techniques may still be important in the future, the limitations include the limited range of types of nanoparticles that can be formed using these techniques, the difficulty in coding specific sites to attract nanoparticles, and there are so far unanswered questions regarding their suitability for scaling.

Finally we mention that several experiments (see for example [20,21,22,23,24,25]) have been performed on percolation in films of metal nanoparticles. Typically nanoparticles are deposited between electrical contacts and a clear onset of conduction can be observed at the percolation threshold. The experimental literature contains no reports of percolation in films of nanoparticles where the films have nanoscale overall dimensions (i.e. where the contact separation is small) and to our knowledge there are no proposals in the literature for the use of percolating films in nanoscale devices. The use of macroscopic contact separations ensures that even at the percolation threshold the properties of the film are strongly affected by the relatively homogeneous nature of the macroscopic cluster assembled film, even though somewhere in the structure a narrow channel may exist in which a single particle or several neighbouring particles create a narrow wire-like structure. There has been no previous proposal to use nanoscale cluster chains formed at the percolation threshold in nanoscale electronic devices.

OBJECT OF THE INVENTION

It is an object of the invention to provide a method of preparing nanoscale wire-like structures, and/or devices formed therefrom which overcome one or more of the above-mentioned disadvantages, or which at least provide the public with a useful alternative. In addition, the process of formation of the wire-like structures, and in particular the electrical monitoring of their formation, can be used as a method for detecting the formation of a cluster film with a pre-specified coverage.

SUMMARY OF THE INVENTION

According to a first aspect of the invention there is provided a method of forming at least a single conducting chain of nanoparticles between a number of contacts on a substrate comprising or including the steps of:
    a. forming the contacts on the substrate,
    b. preparing a plurality of nanoparticles,
    c. deposition of a plurality of nanoparticles on the substrate at least in the region between the contacts,
    d. formation of a conducting chain of nanoparticles between the contacts.

Preferably there are two contacts which are separated by a distance smaller than 10 microns, more preferably the contacts are separated by a distance less than 1000 nm.

Preferably the nanoparticles are composed of two or more atoms, which may or may not be of the same element.

Preferably the nanoparticles may be of uniform or non-uniform size, and the average diameter of the nanoparticles is between 0.5 nm and 1,000 nm.

Preferably the nanoparticle preparation and deposition steps are via inert gas aggregation and the nanoparticles are atomic clusters made up of a plurality of atoms which may or may not be of the same element.

Preferably the substrate is an insulating or semiconductor material, more preferably the substrate is selected from silicon, silicon nitride, silicon oxide aluminium oxide, indium tin oxide, germanium, gallium arsenide or any other III-V semiconductor, quartz, or glass.

Preferably the nanoparticles are selected from bismuth, antimony, aluminium, silicon, germanium, silver, gold, copper, iron, nickel or cobalt clusters.

Preferably the contacts are formed by lithography.

Preferably the formation of the at least a single conduction chain is either by:
    i. monitoring the conduction between the contacts and ceasing deposition at or near to the onset of conduction, and/or
    ii. modifying the substrate surface, or taking advantage of pre-existing topographical features, so as to cause the nanoparticles to form a nanowire when deposited in the region of the modification or topographical features.

In one preferred embodiment the step of formation of the chain of conducting nanoparticles is step i., and the geometry of the contacts in relation to each other and in relation to nanoparticle size has been optimised so as to increase the likelihood of the formation of a chain of nanoparticles at a surface coverage where conduction would not normally be expected in a macroscopic film or part thereof, of the same particles.

Preferably the optimisation is via percolation theory calculations, wherein percolation theory defines a percolation threshold, at which such an arrangement or system becomes conducting, and wherein optimisation gives rise to conduction at a surface coverage that is smaller than the percolation threshold.

Preferably the average nanoparticle diameter is between 0.5 nm to 1000 nm, the contacts are spaced apart by between 4-6× the average nanoparticle diameter; and the width of each contact is substantially more than 10× the contact spacing.

Preferably the overall geometry of contacts is an interdigitated geometry.

Preferably the conditions are such to discourage diffusion of the nanoparticles on the substrate surface, including the conditions of temperature, surface smoothness, and/or identity.

Preferably the nanowire structure is encapsulated in an insulating or dielectric material which protects it from oxidisation and allows the fabrication of a third contact, isolated from the nanowire, and which can therefore act as a gate.

Preferably the nanowire structure is fabricated on a multi-layer substrate, one layer of which is electrically conducting and can therefore act as a gate.

In an alternative preferred embodiment the step of formation of the chain of conducting nanoparticles is via step ii., and the average nanoparticle diameter is between 0.5 nm to 1000 nm.

Preferably the modification includes formation of a step, depression or ridge in the substrate surface, running substantially between two contacts.

Preferably the modification comprises formation of a groove having a substantially v-shaped cross-section running substantially between the contacts.

Preferably the conditions are such to encourage diffusion of the nanoparticles on the substrate surface, including the conditions of temperature, surface smoothness and/or surface type and/or identity.

Preferably the modification is by lithography and etching.

According to a second aspect of the invention there is provided a single conducting chain of nanoparticles between a number of contacts on a substrate prepared substantially according to the above method.

According to a third aspect of the invention there is provided a method of forming a conducting nanowire between two contacts on a substrate surface comprising or including the steps of:
 a. forming the contacts on the substrate,
 b. preparing a plurality of nanoparticles,
 c. depositing a plurality of nanoparticles on the substrate at least in the region between the contacts,
 d. monitoring the formation of the conducting nanowire by monitoring conduction between the two contacts, and ceasing deposition at the onset of conduction,
 wherein the contacts are separated by a distance smaller than 10 microns.

Preferably the contacts are separated by a distance smaller than 100 nm.

Preferably the nanoparticles have an average diameter between 0.5 nm and 1,000 nm, and may be of uniform or non-uniform size.

Preferably the nanoparticle preparation and deposition steps are via inert gas aggregation and the nanoparticles are atomic clusters made up of two or more atoms, which may or may not be of the same element.

In one preferred embodiment the geometry of the contacts has been optimised by percolation theory calculations to provide a conducting nanowire at a surface coverage of nanoparticles on the substrate, in the region between the contacts, of less than a percolation threshold coverage of 70%.

Preferably the surface coverage is less than 30%; more preferably the surface coverage is substantially in the region of 20%.

Preferably the optimal geometry requires:
 a rectangular region between the contacts (or a geometrically equivalent region such as interdigitated contacts);
 the contacts spaced apart by less than 60× the average nanoparticle diameter, and
 the width of each contact being between more than 10× the contact spacing.

Preferably:
 The contacts are spaced apart by between 4-6× the average nanoparticle diameter; and
 the length of each contact is substantially more than 10× the contact spacing.

Preferably the average nanoparticle diameter is substantially between 0.5 nm to 1,000 nm.

Preferably the overall geometry of contacts is an interdigitated geometry.

Preferably the conditions are such to discourage diffusion of the nanoparticles on the substrate surface, including the conditions of temperature, surface smoothness and/or surface type and/or identity.

In an alternative preferred embodiment the topography of the substrate in the region between the contacts is such to promote the formation of a conducting path of nanoparticles between the contacts.

Preferably the method includes an additional step before or after step a) or b) but at least before step c) of:
 i) Modifying the surface to provide topographical assistance to the positioning of the depositing nanoparticles in order to give rise to a conducting pathway.

Preferably the modification includes formation of a step, depression or ridge in the substrate surface, running substantially between two contacts.

Preferably the modification comprises formation of a groove having a substantially v-shaped cross-section running substantially between the contacts.

Preferably the modification is by lithography and etching.

Preferably the conditions are such to encourage diffusion of the nanoparticles on the substrate surface, including the conditions of temperature, surface smoothness and/or surface type and/or identity.

Preferably the substrate is an insulating or semiconducting material; more preferably the substrate is selected from silicon, silicon nitride, silicon oxide, aluminium oxide, indium tin oxide, germanium gallium arsenide or any other III-V semiconductor, quartz, glass.

Preferably the nanoparticles are selected from bismuth, antimony, aluminium, silicon, germanium, silver, gold, copper, iron, nickel or cobalt clusters.

According to a fourth aspect of the invention there is provided a conducting nanowire between two contacts on a substrate surface prepared substantially according to the above method.

According to a fifth aspect of the invention there is provided a method of forming a conducting nanowire between two contacts on a substrate surface comprising or including the steps of:
 a. forming the contacts on the substrate,
 b. preparation of a plurality of nanoparticles,
 c. depositing a plurality of nanoparticles, on the substrate in the region between the contacts,
 d. achieving a single nanowire running substantially between the two contacts by either:
  i. monitoring the conduction between the contacts and ceasing deposition at the onset of conduction, and/or
  ii. modifying the substrate to achieve, or taking advantage of pre-existing topographical features which will cause the nanoparticles to form the nanowire.

Preferably the contacts are separated by a distance smaller than 10 microns; more preferably the contacts are separated by a distance smaller than 100 nm.

Preferably the average diameter of the nanoparticles is between 0.5 nm and 1,000 nm, and may be of uniform or non-uniform size.

Preferably the nanoparticle preparation and deposition steps are via inert gas aggregation and the nanoparticles are atomic clusters made up of two or more atoms which may or may not be of the same element.

Preferably the contacts are formed by lithography.

Preferably the substrate is an insulating or semiconducting material.

Preferably the substrate is selected from silicon, silicon nitride, silicon oxide, aluminium oxide, indium tin oxide, germanium, gallium arsenide or any other III-V semiconductor, quartz, or glass.

Preferably the nanoparticles are selected from bismuth, antimony, aluminium, silicon, germanium, silver, gold, copper, iron, nickel or cobalt clusters.

According to a sixth aspect of the invention there is provided a conducting nanowire between two contacts on a substrate surface prepared substantially according to the above method.

According to a seventh aspect of the invention there is provided a method of fabricating a nanoscale device including or requiring a conduction path between two contacts formed on a substrate, including or comprising the steps of:
A. preparing a conducting nanowire between two contacts on a substrate surface as described in any of the above methods.
B. incorporating the contacts and nanowire into the nanoscale device.

Preferably the device includes two or more contacts and includes one or more of the conducting nanowires.

Preferably conduction through the chain is initiated by an applied voltage or current, either during or subsequent to the deposition of the particles.

Preferably the step of incorporation results in any one or more of the following embodiments:
1. two primary contacts having the conducting nanowire between them, and a least a third contact on the substrate which is not electrically connected to the primary contacts thereby capable of acting as a gate or other element in a amplifying or switching device, transistor or equivalent; and/or
2. two primary contacts having the conducting nanowire between them, an overlayer or underlayer of an insulating material and a least a third contact on the distal side of the overlayer or underlayer from the primary contacts, whereby the third contact is capable of acting as a gate or other element in a switching device, transistor or equivalent; and/or
3. the contacts and/or nanowire are protected by an oxide or other non-metallic or semi-conducting film to protect it and/or enhance its properties; and/or
4. a capping layer (which may or may not be doped) is present over the surface of the substrate with contacts and nanowire, which may or may not be the film of 3.
5. the nanoparticles being annealed on the surface of the substrate;
6. the position of the nanoparticles are controlled by a resist or other organic compound or an oxide or other insulating layer which is applied to the substrate and then processed using lithography and/or etching to define a region or regions where nanoparticles may take part in electrical conduction between the contacts and another region or regions where the nanoparticles will be insulated from the conducting network.

Preferably the device is a transistor or other switching device, a film deposition control device, a magnetic field sensor, a chemical sensor, a light emitting or detecting device, or a temperature sensor.

Preferably the device is a deposition sensor monitoring deposition of a nanoparticle film, and includes at least a pair of contacts with an optimised geometry such that the onset of conduction in the device occurs at a surface coverage where conduction would not normally be expected in a macroscopic film of the same particles, wherein the contact spacing can be selected so as to vary the surface coverage at, or near, the onset of conduction and wherein as a result of the predefined contact spacing the onset of conduction in the nanoparticle film is used to sense when a pre-determined coverage of nanoparticles in the film has been achieved.

Preferably the device is a deposition sensor and the nanoparticles are coated in ligands or an insulating layer such that the onset of tunnelling conduction is used to monitor the film thickness.

According to an eighth aspect of the invention there is provided a nanoscale device including or requiring a conduction path between two contacts formed on a substrate prepared substantially according to the above method.

According to a ninth aspect of the invention there is provided a nanoscale device including or requiring a conduction path between two contacts formed on a substrate including or comprising:
i) At least two contacts on the substrate,
ii) plurality of nanoparticles forming a conducting chain or path of nanoparticles between the contacts.

Preferably there are two contacts which are separated by a distance smaller than 10 microns.

Preferably the contacts are separated by a distance less than 1000 nm.

Preferably conduction through the chain is initiated by an applied voltage or current, either during or subsequent to the deposition of the particles Preferably the nanoparticles are composed of two or more atoms, which may or may not be of the same element.

Preferably the nanoparticles may be of uniform or non-uniform size, and the average diameter of the nanoparticles is between 0.5 nm and 1,000 nm.

Preferably the substrate is an insulating or semiconducting material.

Preferably the substrate is selected from silicon, silicon nitride, silicon oxide, aluminium oxide, indium tin oxide, germanium, gallium arsenide or any other III-V semiconductor, quartz, or glass.

Preferably the nanoparticles are selected from bismuth, antimony, aluminium, silicon, germanium, silver, gold, copper, iron, nickel or cobalt clusters.

Preferably the at least a single conduction chain has been formed either by;
i. monitoring the conduction between the contacts and ceasing deposition at the onset of conduction, and/or
ii. modifying the substrate surface, or taking advantage of pre-existing topographical features, which will cause the nanoparticles to form the nanowire when deposited in the region of the modification or topographical features.

In a preferred embodiment the at least single conduction chain was formed by step i. and the average nanoparticle diameter is between 0.5 nm to 1000 nm, the contacts are spaced apart by between 4-6× the average nanoparticle diameter; and the length of each contact is substantially more than 10× the contact spacing.

Preferably the overall geometry of the contacts is an interdigitated geometry.

In an alternative preferred embodiment the step of formation of the chain of conducting nanoparticles is by step ii., and wherein the average nanoparticle diameter is 0.5 nm to 1000 nm.

According to a tenth aspect of the invention there is provided single conducting chain of nanoparticles between a number of contacts on a substrate substantially as described herein with reference to any one or more of the figures and or examples.

According to an eleventh aspect of the invention there is provided a conducting nanowire between two contacts on a substrate surface substantially as described herein with reference to any one or more of the figures and or examples.

According to a twelfth aspect of the invention there is provided a method of preparing a single conducting chain of nanoparticles between a number of contacts on a substrate substantially as described herein with reference to any one or more of the figures and or examples.

According to a thirteenth aspect of the invention there is provided a method of preparing a conducting nanowire between two contacts on a substrate surface substantially as described herein with reference to any one or more of the figures and or examples.

DEFINITIONS

"Nanoscale" as used herein has the following meaning—having one or more dimensions in the range 0.5 to 1000 nanometres.

"Nanoparticle" as used herein has the following meaning—a particle with dimensions in the range 0.5 to 1000 nanometres, which includes atomic clusters formed by inert gas aggregation or otherwise.

"Nanowire" as used herein has the following meaning—a pathway formed by the assembly nanoparticles which is electrically conducting substantially or entirely via ohmic conduction (as compared to tunnelling conduction, for example). FIG. 1 illustrates such a pathway. It is not restricted to a single linear form but may be direct, or indirect. It may also have side branches or other structures associated with it. The nanoparticles may or may not be partially or fully coalesced, so long as they are able to conduct. The definition of nanowire may even include a film of particles which is homogeneous in parts but which has a limited number of critical pathways; it does not include homogeneous films of nanoparticles or homogeneous films resulting from the deposition of nanoparticles.

"Contact" as used herein has the following meaning—an area on a substrate, usually but not exclusively comprising an evaporated metal layer, whose purpose is to provide an electrical connection between the nanowire or cluster deposited film and an external circuit or an other electronic device. A single contact has a width, w; in respect of two contacts they are separated by a separation L (see FIG. 1).

"Atomic Cluster" or "Cluster" as used herein has the following meaning—a nanoscale aggregate of atoms formed by any gas aggregation or one of a number of other techniques [26] with diameter in the range 0.5 nm to 1000 nm, and typically comprising between 2 and $10^7$ atoms.

"Substrate" as used herein has the following meaning—an insulating or seminconducting material comprising one or more layers which is used as the structural foundation for the fabrication of the device. The substrate may be modified by the deposition of electrical contacts, by doping or by lithographic processes intended to cause the formation of surface texturing.

"Conduction" as used herein has the following meaning—electrical conduction which includes ohmic conduction but excludes tunnelling conduction. The conduction may be highly temperature dependent as might be expected for a semiconducting nanowire as well as metallic conduction.

"Chain" as used herein has the following meaning—a pathway or other structure made up of individual units which may be part of a connected network. Like a nanowire it is not restricted to a single linear form but may be direct, or indirect. It may also have side branches or other structures associated with it. The nanoparticles may or may not be partially or fully coalesced, so long as they are able to conduct. The definition of chain may even include a film of particles which is homogeneous in parts but which has a limited number of critical pathways; it does not include homogeneous films of nanoparticles or homogeneous films resulting from the deposition of nanoparticles.

"Interdigitated Contacts" as used herein has the following definition—A pair of contacts arranged so that one or more digits from each contact is interleaved among digits from the other, as is illustrated in FIG. 4 for example.

"Percolation Theory" as used herein has the following definition—A understanding of the formation of connected structures of randomly occupied sites, where there is a regular lattice of sites (site percolation) or not (continuum percolation). "Percolation Theory" includes all variations on this theory which allow calculations of important parameters such as the conductivity of a network of sites, probability of percolation and correlation length. It also includes variations on this theory which focus on bonds connecting the site (bond percolation).

"Percolation Threshold" as used herein has the following definition—The least occupancy of the available sites in Percolation Theory at which a connected structure of sites exists which spans one of the dimensions of the system and/or allows electrical conduction across the system.

BRIEF DESCRIPTION OF THE FIGURES

The invention is further described with reference to the accompanying figures:

FIG. 10: Schematic illustration of the cluster deposition process.

FIG. 11: Schematic illustration of an electrical measurement through a percolating cluster film.

FIG. 12: Schematic illustration of electrical measurement on a film with a square (L×L) contact geometry FIG. 13: Schematic illustration of the electrical measurement on a film with a rectangular (L×w) contact geometry i.e. the width of the contacts (w) and spacing between the contacts (L) is different.

FIG. 17: Connected (a) and unconnected (b) structures with the same nominal coverage.

FIG. 18: Percolating L×L films (L~20) with approximate coverages 0.20, 0.40, 0.60 and 0.80.

FIG. 31. Atomic Force microscope images at two different resolutions of the bottom of an 'inverted pyramid' etched into silicon using KOH.

DETAILED DESCRIPTION OF THE INVENTION

Figure 1:
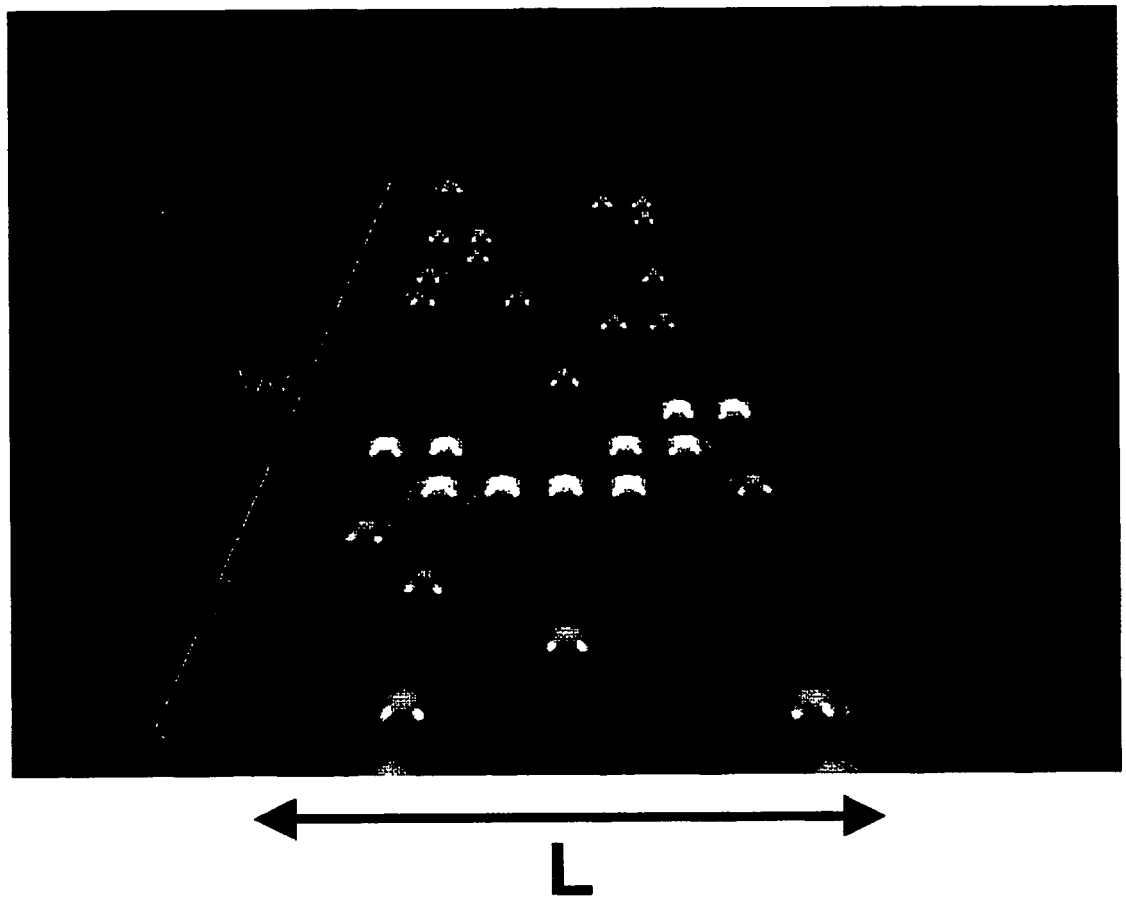
FIG. 1. Schematic representation of clusters deposited between a pair of contacts with separation L, and width w.

The present invention discloses our method of fabricating nanoscale wire-like structures by the assembly of conducting nanoparticles. The advantages of our technology (compared with many competing technologies) include that:

Electrically conducting nanowires can be formed using only simple and straightforward techniques, i.e. cluster deposition and relatively low resolution lithography.

The resulting nanowires are automatically connected to electrical contacts.

Electrical current can be passed along the nanowires from the moment of their formation.

No manipulation of the clusters is required to form the nanowire because the wire is in "self assembled" using one of two techniques described below.

The width of the nanowire can be controlled by the size of the cluster that is chosen.

A. Method of the Invention

The invention relies upon a number of steps and/or techniques:

1. the formation of contacts and/or other lithographically defined patterns on a substrate
2. the formation of nanoscale particles (atomic clusters).
3. Deposition of the clusters onto the substrate
4. monitoring the formation of the nanowire pathway.

1. Formation of Contacts

Electron beam lithography and photolithography are well-established techniques in the semiconductor and integrated circuit industries and currently are the preferred means of contact formation. These techniques are routinely used to form many electronic devices ranging from transistors to solid-state lasers. In our technology the standard lithography processes are used to produce only the contacts to our devices and the active component of the device is a nanowire formed by the deposited atomic clusters. As will be appreciated by one skilled in the art, other techniques of the art which allow for nano-scale contact formation will be included in the scope of the invention in addition to electron beam lithography and photolithography, for example nanoimprint lithography.

Lithography, in conjunction with various etching techniques, can be used to produce surface texturing. In particular, there are various well-established procedures for the formation of V-grooves and related structures such as inverted pyramids, for example by etching silicon with KOH. The scope of the invention includes additional lithography steps designed to achieve surface patterns which assist in the formation of nanowires.

2. Formation of Atomic Clusters

This is a simple process whereby metal vapour is evaporated into a flowing inert gas stream which causes the condensation of the metal vapour into small particles. The particles are carried through a nozzle by the inert gas stream so that a molecular beam is formed. Particles from the beam can be deposited onto a suitable substrate. This process is known as inert gas aggregation (IGA), but clusters could equally well be formed using cluster sources of any other design (see e.g. the sources described in the review [26]), 3. Cluster Deposition The basic design of a cluster deposition system is described in Ref 27 and the contents of which are hereby incorporated by way of reference. It consists of a cluster source and a series of differentially pumped chambers that allow ionisation, size selection, acceleration and focussing of clusters before they are finally deposited on a substrate. In fact, while such an elaborate system is desirable, it is not essential, and our first devices have been formed in relatively poor vacuums without ionisation, size selection, acceleration or focussing.

4. Monitoring the Formation of the Nanowire

The method of the invention involves the monitoring of the conduction between a pair of electrical contacts and ceasing deposition of atomic clusters upon the formation of a conducting connection between the contacts. Alternative or further embodiments may involve monitoring the formation of more than one nanowire structure where more than one nanowire may be useful.

We monitor the formation by checking for the onset of conduction between two contacts. As is discussed below this requires incorporating into our deposition system electrical feedthroughs into the deposition chamber, to allow electrical measurements to be performed on devices during deposition.

There may be some aspects of the invention (as is discussed below with reference to the "TeCAN" formation) where this conduction monitoring may not be required and other variables, such as time of deposition for example, may be employed to estimate or monitor formation.

B. Resultant Technologies

The method of the invention and resulting devices are embodied in two preferred technologies:

a). Percolating Cluster Assembled Nanodevices (Hereinafter PeCANs) and the Related Method These devices are those in which a percolating film is formed between the pair of electrical contacts with nanoscale dimension separations.

We have found that cluster deposition between contacts (see FIGS. 10, 11, 12, 13, 19 and 20) results in structures similar to those described by percolation theory. FIG. 10 provides a schematic illustration of the cluster process. FIG. 11 provides a schematic illustration of an electrical measurement through a percolating cluster film, whilst FIG. 12 provides a schematic illustration of electrical measurement on a film with a square (L×L) contact geometry i.e. the width of the contacts and spacing between the contacts is the same. FIG. 13 provides a schematic illustration of the electrical measurement on a film with a rectangular (L×w) contact geometry i.e. the width of the contacts (w) and spacing between the contacts (L) is different. In the case where w>>L the measurement averages over w/L squares of the kind illustrated in FIG. 12, and so is sensitive to the earliest onset of conduction, and hence the 'narrowest' cluster network in the ensemble.

Percolation is the name given to a simple model where a random fraction p ($0 \leq p \leq 1$) of sites on a lattice are occupied. A cluster deposited film can be approximated by a two dimensional lattice (see FIG. 11) The number, size and shape of the structures form by connected sites are described by Percolation Theory[28]: in an infinite square system the structures generated by connecting neighbouring occupied lattice sites will be small and isolated for $p<p_C$ and form an infinite network for $p>p_C$, where $p_C=0.5927461$ is the percolation threshold. At the critical coverage $p_C$ a geometrical second order phase transition occurs with power-laws and corresponding critical exponents describing the behaviour of quantities such as the correlation length, probability of finding an infinite structure and conductivity.

Figure 6:
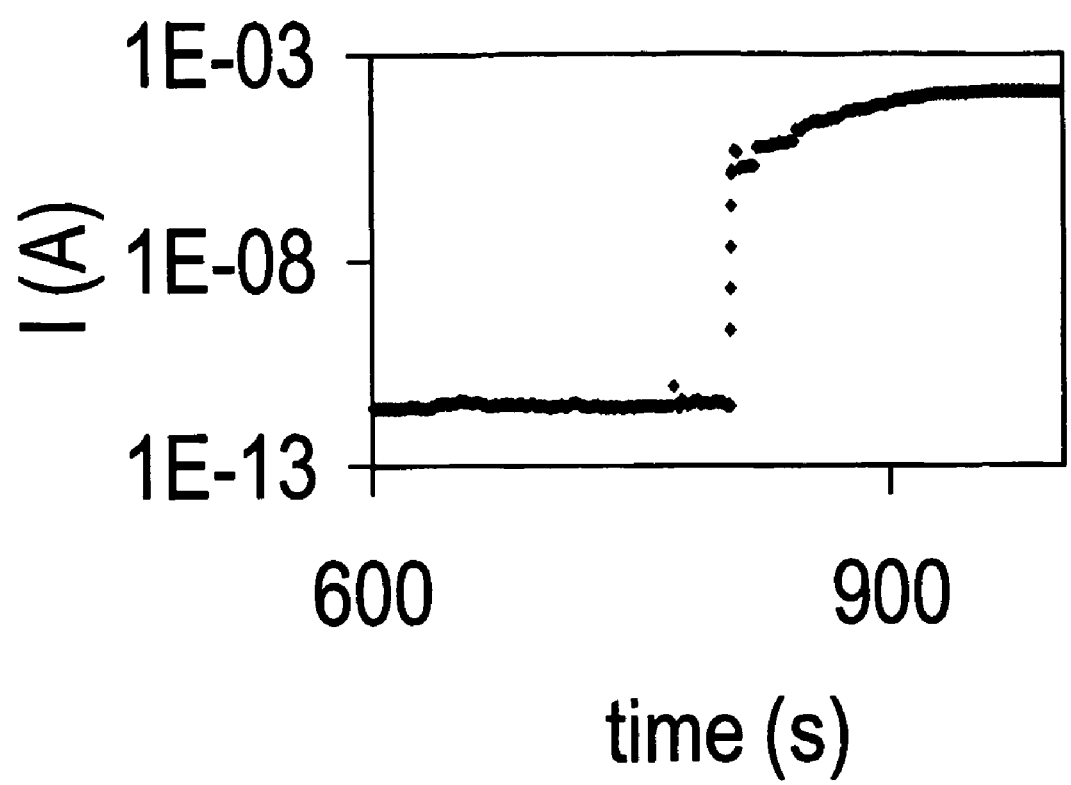
FIG. 6: Current as a function of time for bismuth clusters deposited (at ~0.2 Å/s) on a single set of contacts with separation 1600 nm illustrating the onset conduction.
Figure 8:
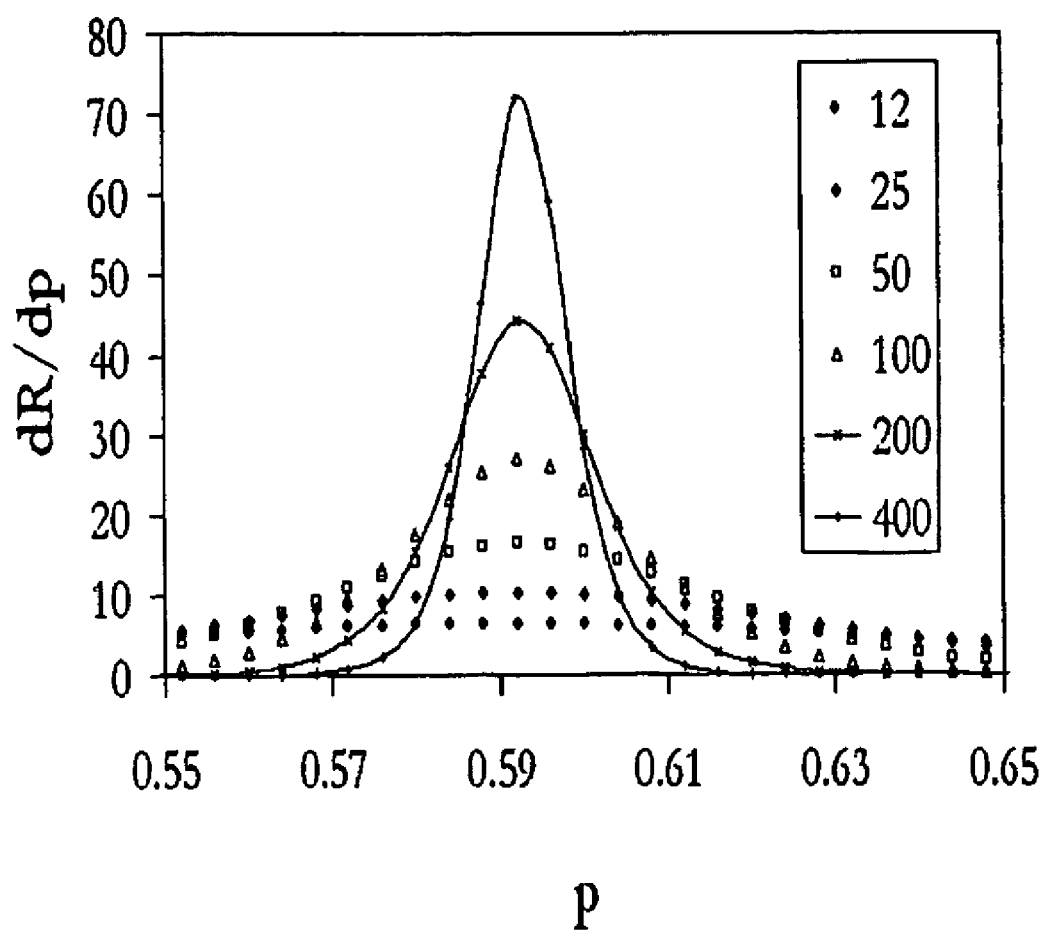
FIG. 8: Probability of observation of the percolation threshold at different coverages (p), for different square system sizes (L).

For a finite size system, as the coverage of the surface, p, increases (see FIG. 18—percolating L×L films (L~20) with approximate coverages 0.20, 0.40, 0.60 and 0.80) the probability of the existence of a conducting path between the contacts increases. This is illustrated in FIG. 8 wherein the probability of observation of the percolation threshold at different coverages (p) is plotted for different square system sizes (L). At any given coverage some of the ensemble of possible cluster configurations may form a conducting path, and some will not. FIG. 17 illustrates possible connected (a) and unconnected (b) structures with the same nominal coverage, for example. At the percolation threshold a nanoscale wire-like structure or structures exists at some place in the network of clusters that lies between the contacts (See FIGS. 1 and 11) and a clear onset of conduction can be observed. This is illustrated in FIG. 6 wherein the current is plotted as a function of time for bismuth clusters deposited (at ~0.2 Å/s) on a single set of contacts with separation 1600 nm illustrating the onset conduction.

With specific reference to FIG. 1 there is provided a schematic representation of clusters deposited between a pair of contacts with separation L, and width w. The clusters form a variety of isolated structures and, in this example, a single network is highlighted that spans the space between the contacts, allowing conduction. At a fixed surface coverage, p, the probability that the clusters form a spanning network decreases with increasing L. Hence the onset of conductivity moves to higher coverages with increasing L. A contact separation which is of order 5 cluster diameters provides the most effective way to achieve a wire-like structure.

Our devices take advantage of the existence of this wire-like structure: by using contact separations that are themselves nanoscale, the properties of the overall devices are significantly affected by the narrowest part of the structure, and the contacts and the rest of the cluster network (which may comprise an essentially continuous film of clusters) plays a less significant role.

In these devices quantum size effects, Coulomb blockade and other physical phenomena specific to nanostructures can determine the properties of the network; in turn these effects can determine the properties of the overall device. Similarly properties of a disordered structure, such as weak localisation, could determine the conductivity of the device and/or the response of the conductivity to electric or magnetic fields.

By monitoring the conductivity of either the device or a neighbouring device during deposition it is possible to observe the onset of conduction and to stop the deposition at a time when the network of nanoparticles is close to the percolation threshold (either just prior to the onset of conduction, in a tunnelling regime, or just after the onset of conduction where the contacts are truly connected by clusters). While a complex network results, and while the precise nature of the network is determined stochastically, the nanoparticles form one or more connected and/or unconnected paths between the contacts, thereby constituting an electrical device.

A feature of this invention is the existence of a single wire-like path or small number of paths between the contacts near the percolation threshold. It therefore becomes unnecessary to isolate or manipulate particles individually, or to use complex fabrication techniques to form a narrow wire. The width of the wire can be controlled by the size of the deposited particles.

Through our study of percolation theory and its application to this problem we have identified a particular preferred (rectangular) geometry for the space between the contacts which allows the formation of a nanowire-like structure at the percolation threshold. The nanowire structure is formed because the percolation threshold, which is usually observed to occur at approximately 60% surface coverage in large systems, is shifted to much lower coverages in rectangular systems with a small contact separation. Hence when the first connection between the contacts is formed by the cluster network the total surface coverage is ~20% and this means that only relatively direct paths between the contacts are allowed.

We have identified a shift in the percolation threshold from a coverage of approximately 0.6 for large systems to approximately 0.2 for systems with small contact spacings. By monitoring the conductivity between the electrical contacts during particle deposition the first connection between the contacts can easily be observed. For any given contact separation the percolation threshold is expected to occur at a different coverage. Hence at the moment that the connection between the contacts is formed, the coverage of deposited particles can be identified from a graph of the percolation threshold versus system size. This enables monitoring of the thickness of the film in the sub-monolayer regime. The monitoring can be done locally and in real-time. Local, real-time monitoring of sub-monolayer particle deposition is difficult or impossible with current technologies.

One advantage of the PeCAN technique is that it allows the formation of a nanowire in the simplest possible way, using minimal lithographic processing. It also allows the formation of devices in which more than one connection between the contacts is achieved and of devices in which a more complicated percolating network is the active core of the device. PeCAN technology can also be used to form deposition control systems (as discussed below).

While the diameter of the nanowire formed is nanoscale the size of the contact pads is relatively large for PeCAN devices, since the contact geometry must approximate a rectangular contact spacing. For optimal nanowire formation a contact spacing of approximately five cluster spacings is required and the length of contacts is required to be large (approx 30000 clusters). Even when folded into the most compact geometry the contacts may fill an area as large as 40 microns by 40 microns (for 50 nm clusters and 200 nm contact spacing), and so the overall device dimensions are significantly larger than the active component of the device, i.e., the nanowire. Hence PeCAN devices are less ideal for the formation of devices which require extremely small ultimate overall device sizes such as transistors on integrated circuits.

The simplicity of the formation of the PeCAN devices is however attractive for formation of devices where a small active component, i.e. a nanowire, is required but the overall device dimensions are not critical, e.g. magnetic field sensors or chemical sensors.

b) Templated Cluster Assembled Nanodevices (Hereinafter TeCANs) and the Related Method This method relies on the same technologies as PeCAN devices except that in addition to cluster deposition and the fabrication of electrical contacts on an appropriate substrate the substrate is etched (or otherwise patterned) to enhance the formation of nanoparticle chains.

It is well established that small particles can diffuse when they land on a sufficiently smooth surface. The particles diffuse until they hit a defect or another particle: for sufficiently low particle fluxes arriving at the surface, the particles aggregate at defects without significantly aggregating with each other. TeCAN is based on the concept that a suitable defect can be engineered to achieve cluster aggregation into nanowires.

The more sophisticated TeCAN technology requires an additional stage of lithographic processing to create surface texturing between the electrical contacts. TeCAN devices could be used for all applications previously discussed for PeCAN devices, but the technology allows the formation of devices with much smaller overall dimensions. Therefore TeCAN devices are more appropriate to applications requiring a high density of devices, for example, transistors.

Figure 28:
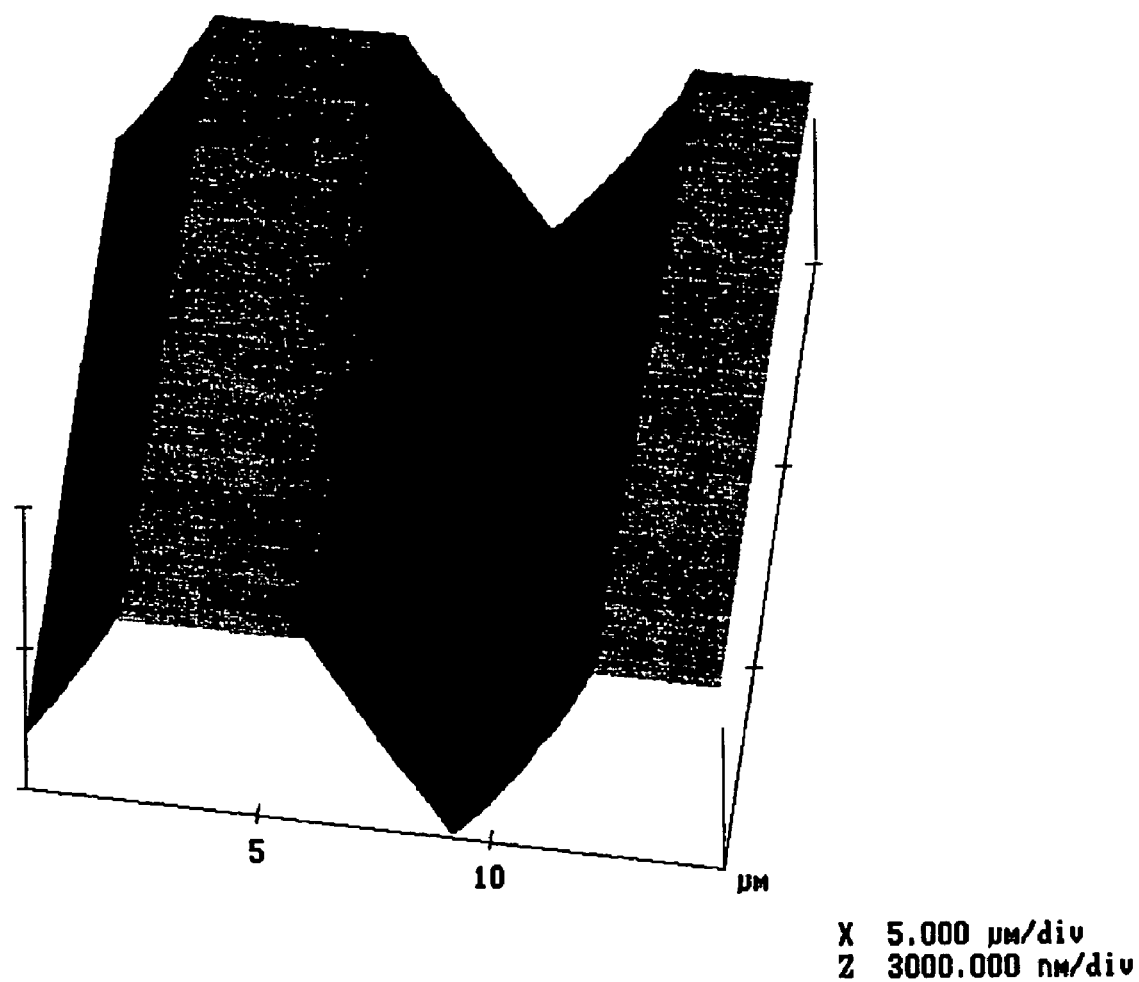
FIG. 28. Atomic Force microscope image of a V-groove etched into silicon using KOH.
Figure 29:
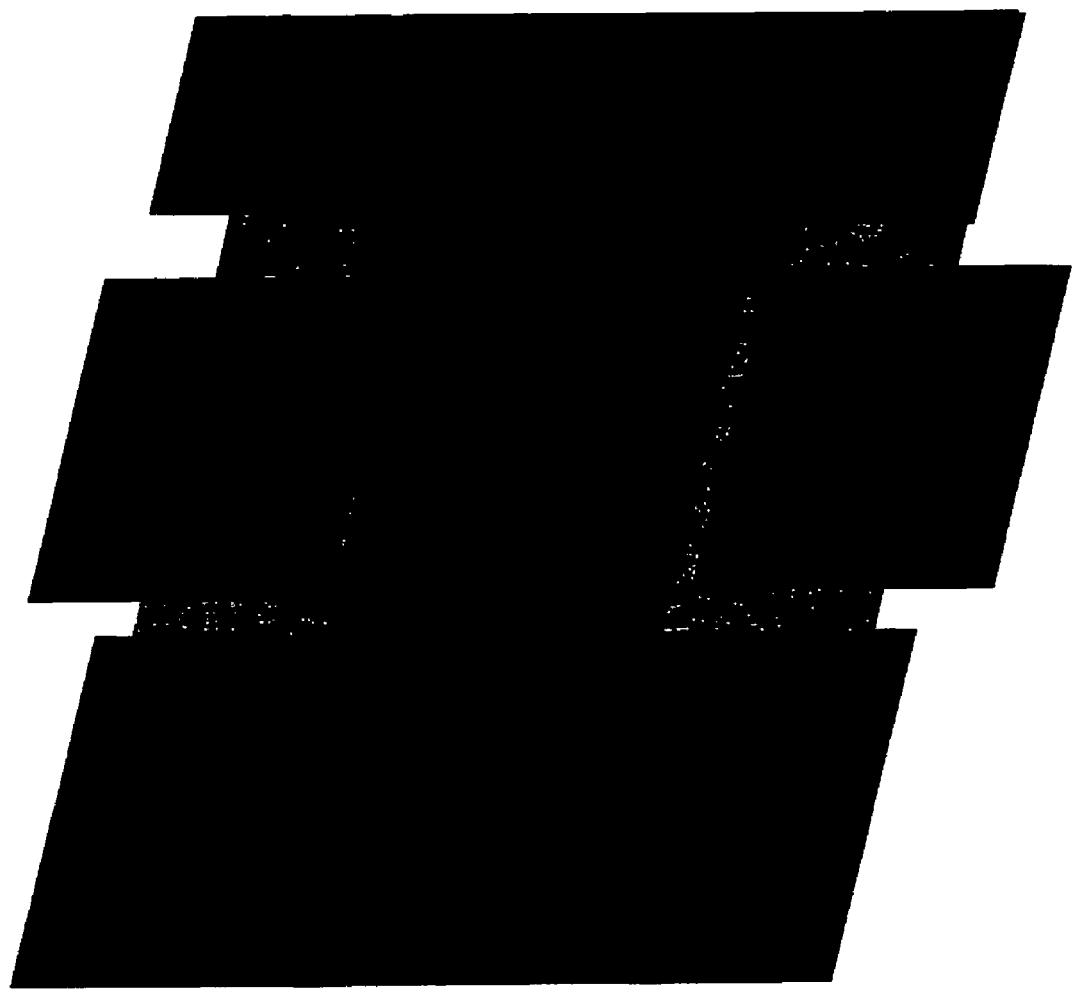
FIG. 29. Schematic illustration of a cluster assembled nanowire created using an AFM image of a V-groove.

In the preferred embodiment, the invention involves using standard lithographic techniques to cause the formation of one or more V-grooves between a pair of electrical contacts (see FIGS. 28, 29, and 31). The flat sides of the V-grooves will allow diffusion of clusters to the apex of the V-groove where they will be localised. Hence, they will gradually aggregate to form a nanowire along the bottom of the apex of the V-groove. One of the attractions of this technique is that the natural tendency of the V-groove to form an orthogonal facet at the end of the groove allows an opportunity to form wires with four contacts. This is likely to be important in a variety of applications.

We can monitor the nanowire formation in the V-groove by measuring the onset of conduction as discussed above (see FIG. 31). Alternatively a wire can be formed and its conduction measured only after its formation.

It is to be noted that although the V-groove texturing discussed is the preferred form of the invention, other forms of surface texturing are included in the scope of the invention.

Diffusion/Temperature Considerations

One requirement for PeCAN technology is that when clusters land on the insulating surface between the electrical contacts they do not move significantly. This will almost always be the case for relatively large clusters (greater than about 10 nanometres in diameter), even at room temperature. For smaller clusters, or in the rare cases where even large clusters diffuse across the insulating surface of interest, the sample can be cooled down prior to deposition to eliminate surface diffusion. In contrast, TeCAN technology relies on surface diffusion for the formation of the nanowire and so small mobile clusters are preferred. Temperature control of the surface can also be used to change the diffusivity of clusters, for example to allow clusters to diffuse on surfaces on which they would otherwise be immobile. (The range of temperatures which can be used to be limited by the melting point of the clusters.) Because relatively few studies have been done on cluster diffusion, the variety of cluster/substrate combinations to which TeCAN technology can be applied is not yet clear. However, semiconductor systems such as gallium arsenide and silicon are known to be suitable for the formation of V-grooves, and it is expected that cluster materials with lattice constants different to the substrates will allow cluster diffusion, especially for small cluster sizes. In contrast, PeCAN technology should be applicable to almost any cluster/substrate combination.

C. Applications of the Invention

An important characteristic of the nanowires formed by the method of the invention is that in general they will be sensitive to many different external factors (such as light, temperature, chemicals, magnetic fields or electric fields) which in turn give rise to a number of applications. Devices of the invention may be employed in any one of a number of applications. Applications of the devices include, but are not limited to:

Transistors or Other Switching Devices

Figure 14:
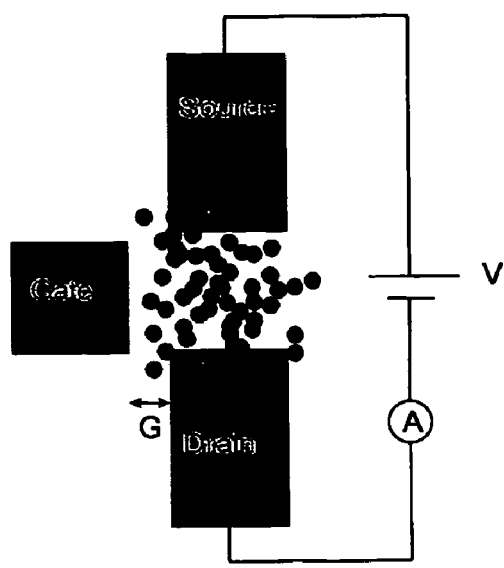
FIG. 14: Schematic illustration of a three terminal device.
Figure 15:
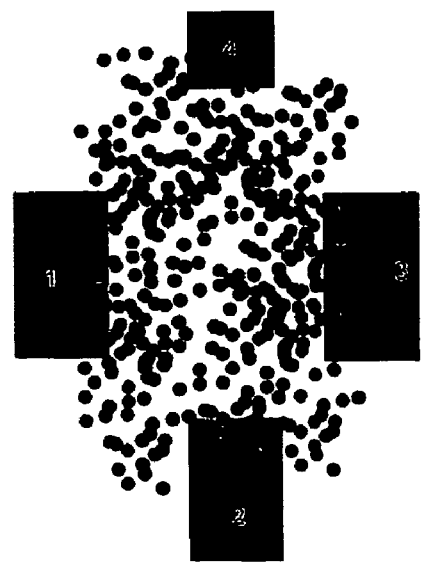
FIG. 15: Schematic illustration of a four terminal device in which the contacts have similar spacings.
Figure 30:
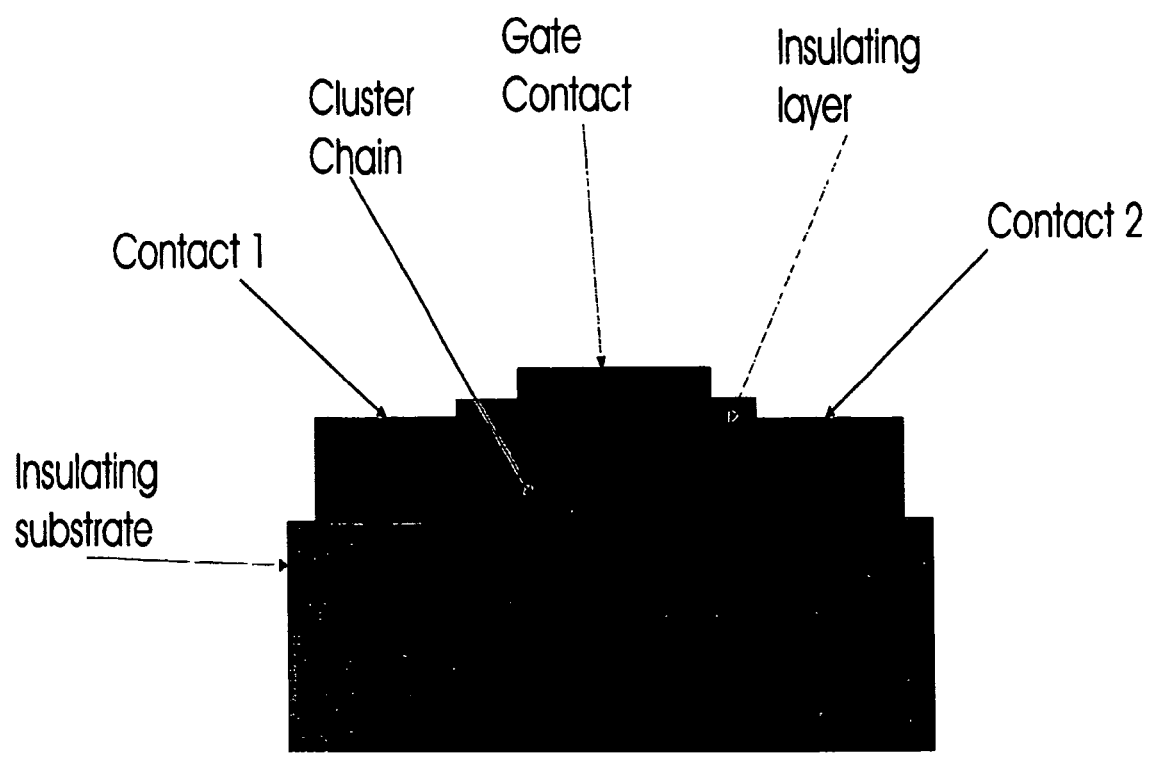
FIG. 30. Side view of a FET structure fabricated by first deposition of an insulating layer on top of the cluster assembled nanowire followed by lithographic definitions of a gate contact.

A number of the devices described below allow switching using a mode similar to that of a field effect transistor. FIGS. 14, 15 and 30 illustrate such devices. FIG. 14 is a schematic illustration of a three terminal device. The distance G between the gate and other contacts can be varied to determine the contact's function. FIG. 15 shows a schematic illustration of a four terminal device in which the contacts have similar spacings. Once one connection has formed the function of the contacts is determined.

Transistors formed from a combination of electron beam lithography and the placement of a single gated carbon nanotube (which simply acts as a nanowire) between electrical contacts have been fabricated by a number of groups (see e.g. [1]) and have been shown to perform with transconductance values close to those of the silicon MOSFET devices used in most integrated circuits. Both PeCAN and TeCAN technology can be used to form an equivalent conducting nanowire between a pair of contacts. This wire can be seen as a direct replacement for the carbon nanotube in the carbon nanotube transistor. The advantage of using PeCAN or TeCAN technology to form these devices is that these technologies eliminate the need to use slow and cumbersome manipulation techniques to position the nanowire. Using PeCAN and TeCAN technology the nanowire is automatically connected to the electrical contacts, and in the case of TeCAN technology the position of the nanowire is predetermined.

In all cases it is critical that a third (gate) contact is provided to control current flow through the nanowire. In the cases of both TeCAN and PeCAN technology to achieve switching the use of both top gate (see FIG. 30) and bottom gate technology can be considered. However the preferred embodiment is the use of a TeCAN device with a third contact in the same plane, or close to the same plane, as the nanowire (see FIGS. 14 and 15). In this case the TeCAN based transistor is very similar to that of the carbon nanotube transistor discussed above[1].

The preferred embodiment of this device is one in which semiconductor nanoparticles such as germanium clusters are guided to the apex of a V-groove (or V-grooves) etched into the substrate which may be a different semiconductor, such as silicon or Gallium Arsenide, or possibly the same semiconductor but with a thin oxide layer to insulate the nanowire from the substrate. Further preferred embodiments of this device involve metallic cluster wires such as Bismuth or Nickel nanowires.

Deposition Control Systems

As described above the shift of the percolation threshold (onset of conduction) with system size in a rectangular percolating system provides a mechanism for sensing the formation of a cluster film with a prespecified mean surface coverage.

There are many processes (both in industry and in scientific research) where nanoscale (or larger) particles are deposited onto substrates. By far the most common method used for measuring the thickness of the deposited film is a quartz crystal deposition rate monitor. The sensors rely on a change of the natural oscillating frequency of the quartz with the thickness of deposited material. While this technology is well established and highly reliable it suffers from a number of problems. Firstly it is difficult to monitor very small film thicknesses. Secondly, unless the particle beam has a large diameter, deposition onto the sample and monitoring of the deposition must often be done alternately, i.e. either the deposition monitor or the sample must be moved to allow access to the other. This is almost always the case when the particles are deposited from a molecular beam. Thirdly the quartz crystals usually used in these sensors are typically 8-10 mm across and so it is only possible to obtain an average measurement of the deposited thickness across the area of the sensor.

PeCAN technology allows the monitoring of the deposited sample film thickness in the sub-monolayer regime in real time at a highly localised level, without the need to move the sample or the monitor.

The PeCAN deposition control concept is that in many applications it is a straightforward procedure to define interdigitated electrical contacts onto the sample onto which the clusters (or even larger particles) are being deposited. For example, it should be possible to monitor the deposition of nanoparticles into a single electron transistor by fabricating the contact structure for the single electron transistor and the pair of interdigitated contacts sufficiently close to each other. Appropriate choice of the separation and length of the gap between the interdigitated contacts moves the onset of conduction to a specified film thickness and determines the precision of the measurement (see FIGS. 21, 22, 23). The onset of conduction can be monitored by a simple current sensing arrangement which then triggers the closure of a shutter, thus stopping the deposition of the nanoparticles at a predetermined mean coverage.

The deposition monitor can only be used once, but fabrication of the devices will be so inexpensive that one-time usage will not be a problem. Obviously, stand-alone sensors, fabricated on their own substrate, could be used in applications where it is not possible to mount the sensor on the substrate onto which the particles are being deposited.

Note that the deposition monitoring system is applicable to a number of situations other than the deposition of purely conducting nanoparticles. For example ligand-coated nanoparticles in solution are known to settle out, (i.e., precipitate or deposit) onto substrates placed in the solution. Even though conduction between the nanoparticles relies on tunnelling (due to the presence of the ligands), in many situations sufficiently large currents will flow to allow observation of the current. This signal will be used to achieve control of the deposition of particles which do not form conducting connections.

Figure 21:
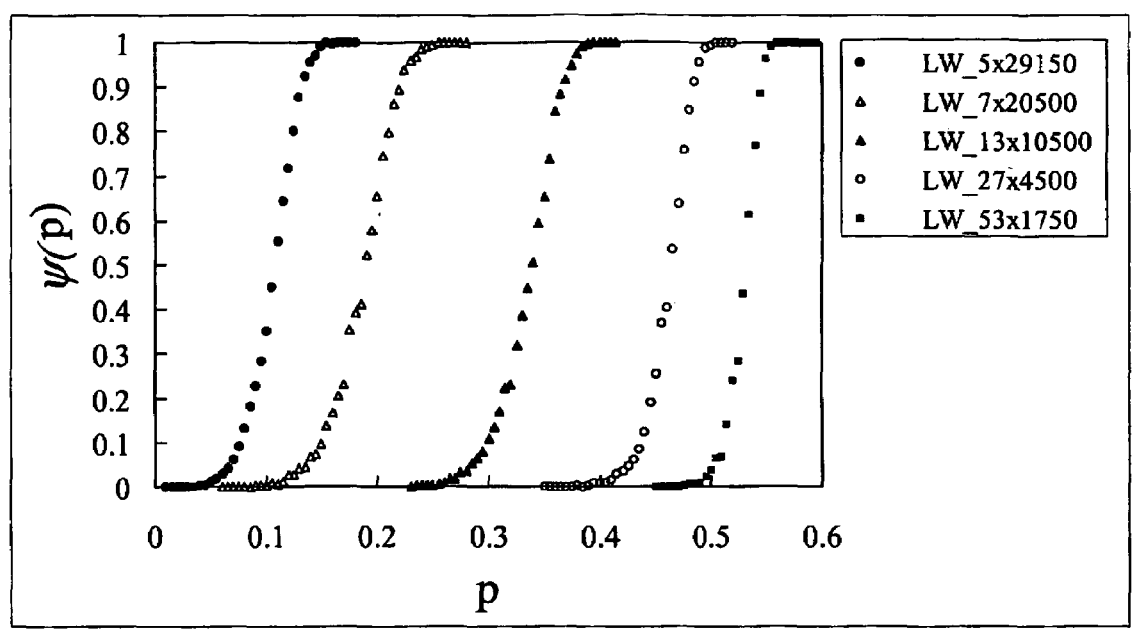
FIG. 21. Plots of probability of percolation as a function of coverage for various L×w rectangular systems.
Figure 22:
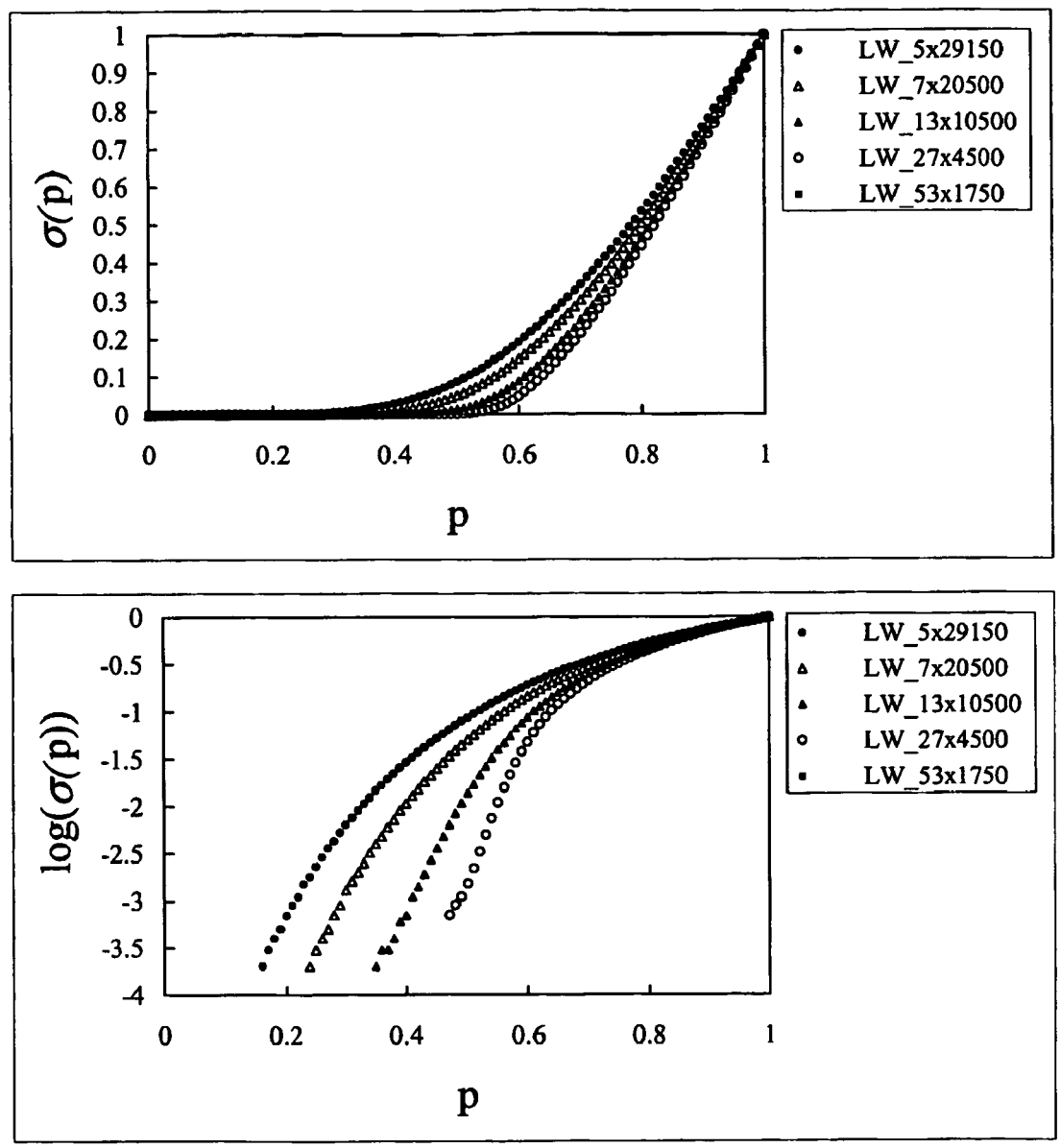
FIG. 22. Plots of conductivity as a function of coverage for various L×w rectangular systems. Top: linear vertical scale. Bottom: log vertical scale.
Figure 23:
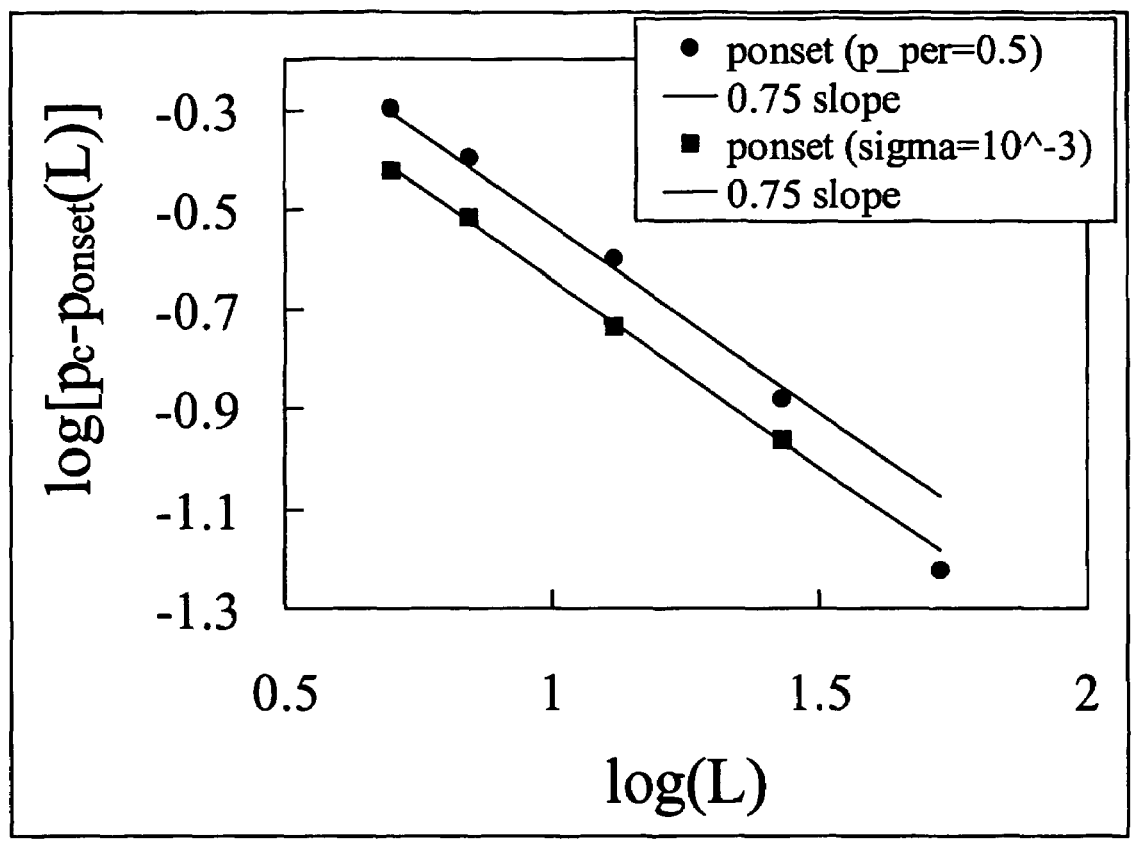
FIG. 23. Log—log plot of the values of $p_{onset}(L)-p_c$ versus system size L, for L×w rectangular systems.

Finally we note that the deposition control concept can be extended beyond the range of surface coverages shown in FIGS. 21, 22 and 23, ( i.e., p=0.2-0.6) as long as the flux of particles is sufficiently invariant with time. For example if the required surface coverage is Y monolayers but the interdigitated finger arrangement is designed to observe the onset on conduction at X monolayers the required deposition time is Y/X multiplied by the time at which the onset of conduction is observed. Hence our deposition system may be applicable to a wide variety of industrial applications requiring deposition of a precisely controlled film of nanoparticles, even those with a very large range of thicknesses.

Magnetic Field Sensors

Magnetic Field Sensors are required for a large number of industrial applications but we focus here on their specific application as a sensor for the magnetic information stored on a high density hard disk drive, or other magnetically stored information, where suitably small magnetic field sensors must be used as readheads. The principle is that the smaller the active component in the readhead, and the more sensitive, the smaller the bits of information on the hard drive can be, and the higher the data storage density.

Magnetoresistance is usually expressed as a percentage of the resistance at zero magnetic field and MR is used as a figure of merit to define the effectiveness of the readhead. Appropriate nanowires are well established as being highly sensitive to magnetic fields, i.e., large magnetoresistances (MR) can be obtained. For example, it has recently been reported that a nickel nanowire can have a MR of over 3000 percent at room temperature. [29] This far exceeds the MR of the GMR effect readhead devices currently in commercial production.

The active part of a readhead based on PeCAN or TeCAN technology would be a cluster assembled nanowire, for example a Nickel or Bismuth nanowire formed by cluster deposition between appropriate contacts (similar to devices shown in FIGS. 14, 15, 26 and 30). Note that the resolution of the readhead would be governed by the size of the nanowire and not by the overall device size (i.e. the contact size is not necessarily important) so even with PeCAN technology high sensitivity readheads might be possible. The mechanism governing the high magnetoresistances required for readheads in PeCAN or TeCAN devices is likely to be spin-dependant electron transport across sharp domain walls within the wire [29] or any one of a number of other effects (or combination of these effects), such as weak or strong localisation, electron focusing, and the fundamental properties of the material from which the clusters are fabricated (e.g. bismuth nanowires are reported to have large MR values).

Furthermore we note that well-defined nanowires may not be essential to the formation of a suitably sensitive readhead. Devices with more complicated cluster networks may also be useful because of the possibility of magnetic focusing of the electrons by the magnetic field from the magnetically stored information, or other magneto-resistive effects. In the case of focusing of the electrons into electrical contacts other than the source and drain and/or into deadends within the cluster network this might result in very strong modulations of the magnetoresistance (measured between source and drain) similar to those achieved in certain ballistic semiconducting devices.

Chemical Sensors

The devices discussed in Ref. [6] demonstrate that a narrow wire can be useful for chemical sensors, and similar chemical sensitivity should be possible due to the response of the narrow wire formed in the narrowest part of devices of the invention. It is well established that very narrow wires, i.e. with nanometre diameters, whether exhibiting quantum conductance or not, can have their conductance modulated strongly by the attachment of molecules to the surface of the wire. This may result from wave function spillage or chemical modification of the surface of the wire. The strong modulation of the conductance of the wire can lead to high chemical sensitivity.

Both the nanowires formed in PeCAN and TeCAN devices, as well as larger cluster networks with a critical current path at some point in the network, may be useful for chemical sensing applications. These applications may be in industrial process control, environmental sensing, product testing, or any one of a number of other commercial environments.

Figure 26:
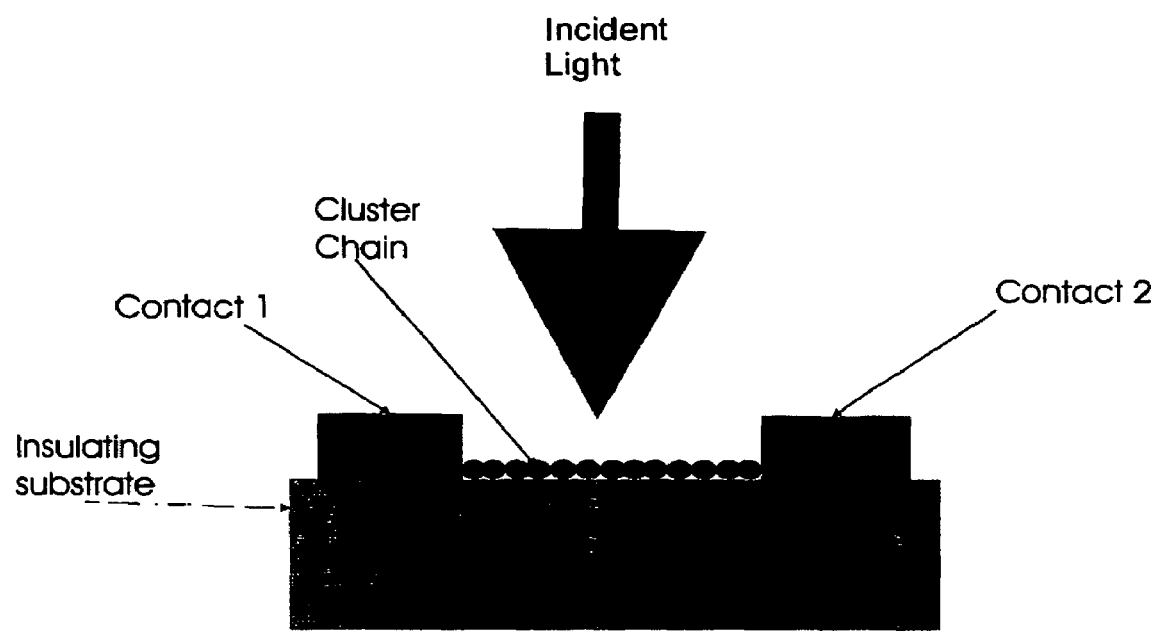
FIG. 26. Schematic of photodiode based on cluster chain.

The preferred embodiment of the device is one similar to that shown in FIG. 26 which uses a cluster material which is sensitive to a particular chemical. Exclusivity would be useful, i.e., it would be ideal to use a material which senses only the chemical of interest and no other chemical, but such materials are rare.

A preferred embodiment of the chemical sensing device is an array of PeCAN or TeCAN nanowires, each formed from a different material. In this case each of the devices acts as a separate sensor and the array of sensors is read by appropriate computer controlled software to determine the chemical composition of the gas or liquid material being sensed. The preferred embodiment of this device would use conducting polymer nanoparticles formed between metallic electrical contacts, although many other materials may equally well be used.

A further preferred embodiment of this device is a PeCAN or TeCAN formed nanowire which is buried in a insulating material, which is itself chemically sensitive. Chemical induced changes to the insulating capping layer will then produce changes in the conductivity of the nanowire. A further preferred embodiment of the device is the use of a insulating and inert capping layer surrounding the nanowire with a chemically sensitive layer above the nanowire, e.g., a suitable conducting polymer layer (i.e. similar to FIG. 30, but with the gate replaced by a chemically sensitive polymer layer). The conducting polymer is then affected by the introduction of the appropriate chemical; changes in the electrical properties of the conducting polymer layer are similar to the action of a gate which can then cause a change in the conduction through the nanowire. Similar devices currently in production are called CHEMFETs.

Light Emitting or Detecting Devices

The devices discussed above (and particularly devices similar to that shown schematically in FIG. 26) may exploit the optical properties of the nanoparticles to achieve a device which responds to or emits light of any specific wavelength or range of wavelengths including ultraviolet, visible or infrared light and thereby forms a photodetector or light emitting diode, laser or other electroluminescent device.

CCD based on silicon technology are well established as the market leaders in electronic imaging. Arrays of PeCAN or TeCAN formed nanowires could equally well be useful as photodetectors for imaging purposes. Such arrays could find applications in digital cameras, and a range of other technologies.

The preferred embodiment of a PeCAN or TeCAN photodetector is a semiconductor nanowire, for example, a wire whose electrical conductance is strongly modulated by light, formed from silicon nanoparticles. In this regard semiconductor nanowires with ohmic contacts at each end maybe appropriate, but it is perhaps more likely that wires connected to a pair of oppositely doped contacts may be more effective. FIG. 26 shows a schematic version of the preferred embodiment—a photodiode based on a cluster chain. The choice of the contacts (either ohmic or Schottky) will significantly influence the response of the device to light. The wavelength of light which the device responds to can be tuned by selection of the diameter of the clusters and/or cluster assembled wire. This is particularly the case for semiconductor nanoparticles where quantum confinement effects can dramatically shift the effective bandgap. Similar devices can be made to emit light. Semiconductor quantum wires built into p-n junctions (e.g. contacts 1 and 2 made to p and n type) can emit light and if built into suitable structures, lasing can be achieved Transistor-like devices (see above) may be the most appropriate as light sensors since they are particularly suited to connection to external or other on-chip electronic circuits.

The wavelength of light which the device responds to can be tuned by selection of the diameter of the clusters and/or cluster assembled wire. This is particularly the case for semiconductor nanoparticles where quantum confinement effects can dramatically shift the effective bandgap.

Similar devices to those discussed above can be made to emit light. Semiconductor quantum wires built into p-n junctions (e.g. contacts 1 and 2 made to p and n type) can emit light and if built into suitable structures, lasing can be achieved Temperature Sensors The unusual properties of the devices may include a rapid or highly reproducible variation in conductivity with temperature, which may be useful as a temperature sensor. Schematic diagrams of devices which might be useful in this regard are shown in FIGS. 14, 15, 26 and 30.

Figure 4:
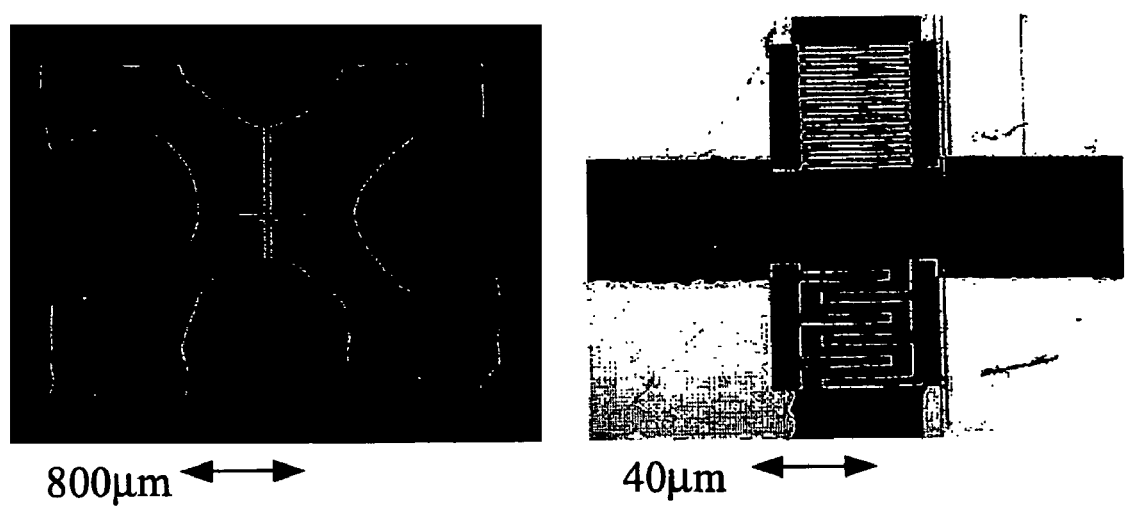
FIG. 4: Double contact arrangement at 50 times magnification showing bonding pads defined by optical lithography (left) and 1000 times magnification showing interdigitated contact arrangements defined by EBL (right).
Figure 5:
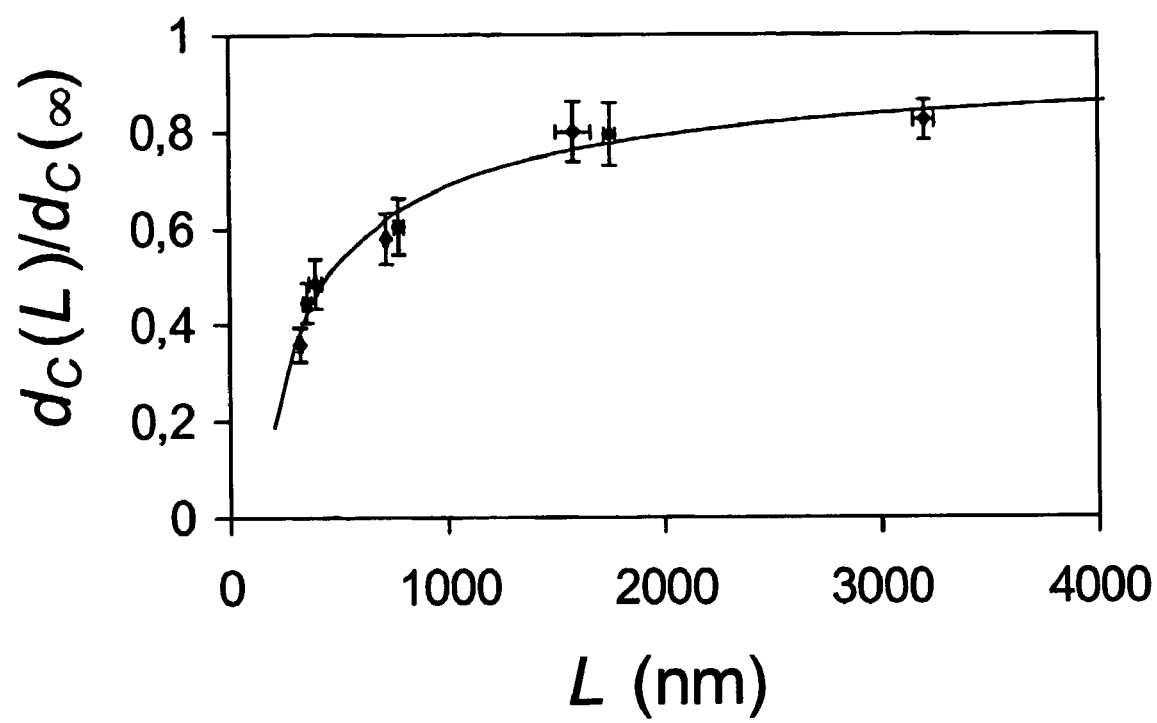
FIG. 5: Normalized critical film thickness $d_C(L)/d_C()$ as a function of system size L (contact separation).
Figure 7:
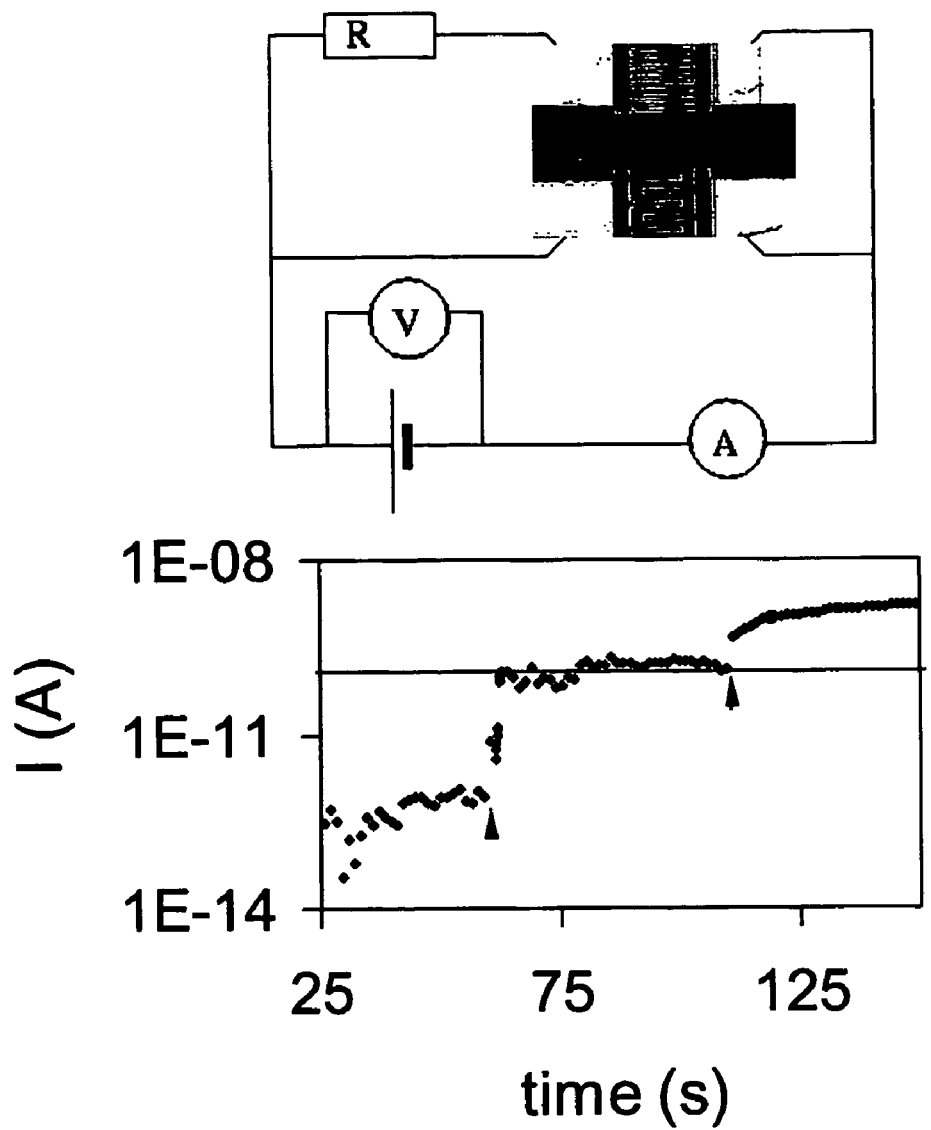
FIG. 7: Double contact arrangement and measurement circuit (Top) used to observe percolation thresholds during the same experimental run (bottom).
Figure 9:
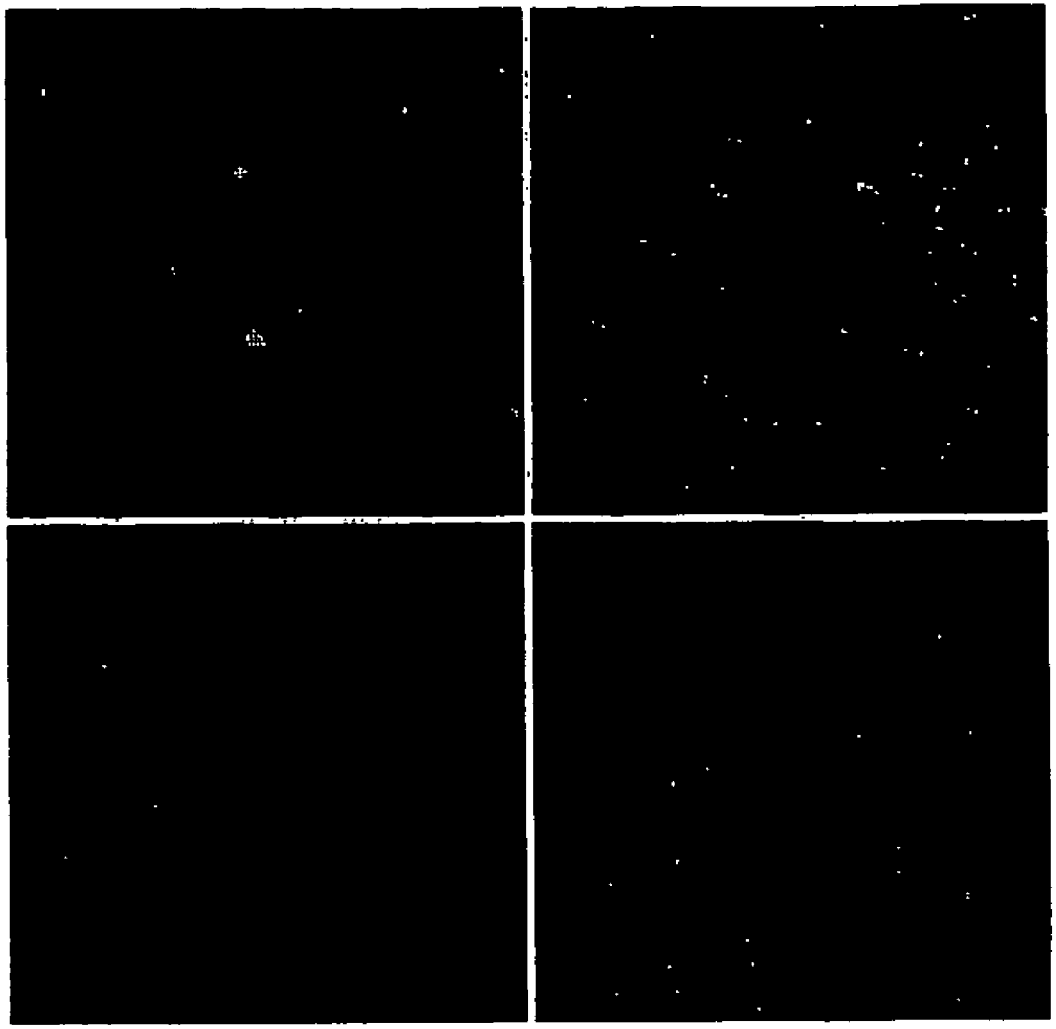
FIG. 9: Atomic force micrographs for increasing cluster coverages.
Figure 16:
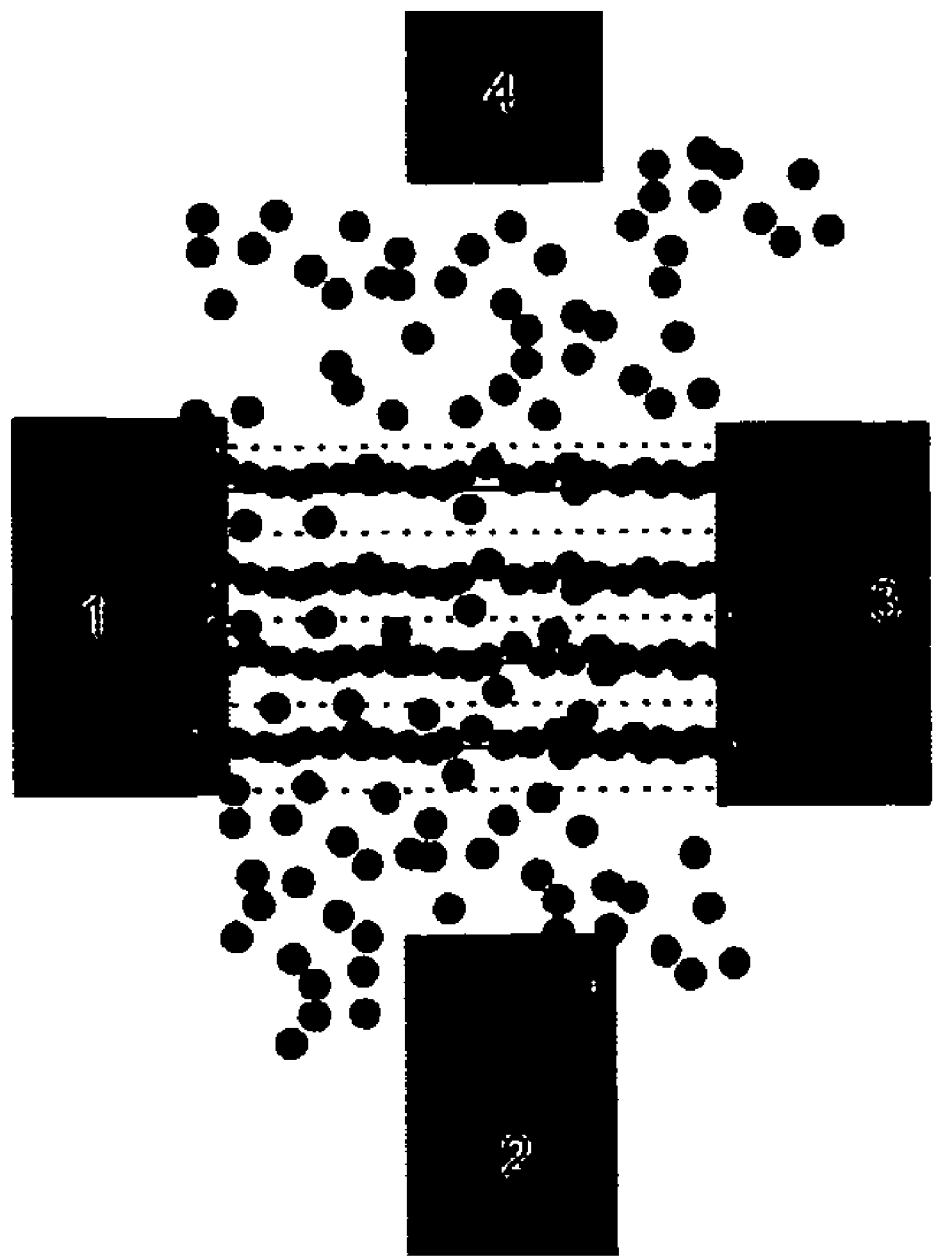
FIG. 16: Similar device to that in FIG. 15 but with V-grooves between contacts 1 and 3.
Figure 24:
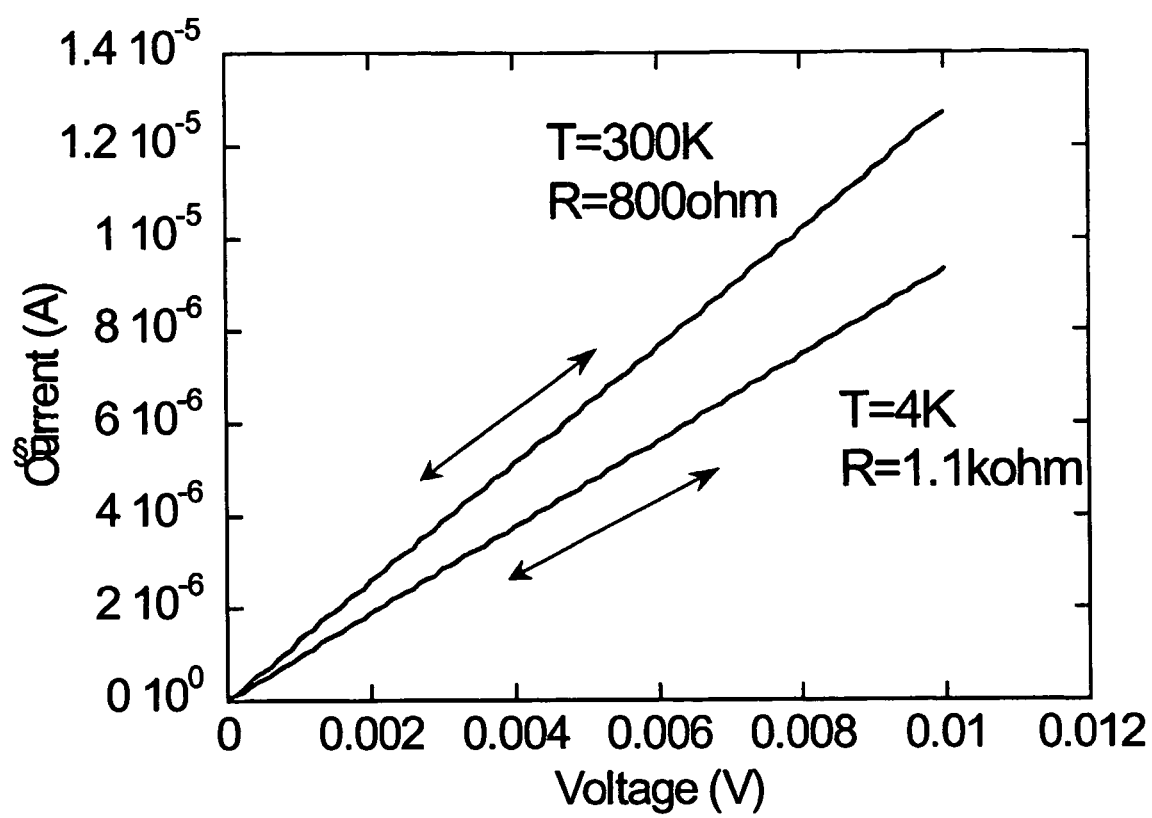
FIG. 24. Current—Voltage characteristics for a bismuth cluster film at two temperatures, showing reproducible, linear low voltage behaviour.
Figure 25:
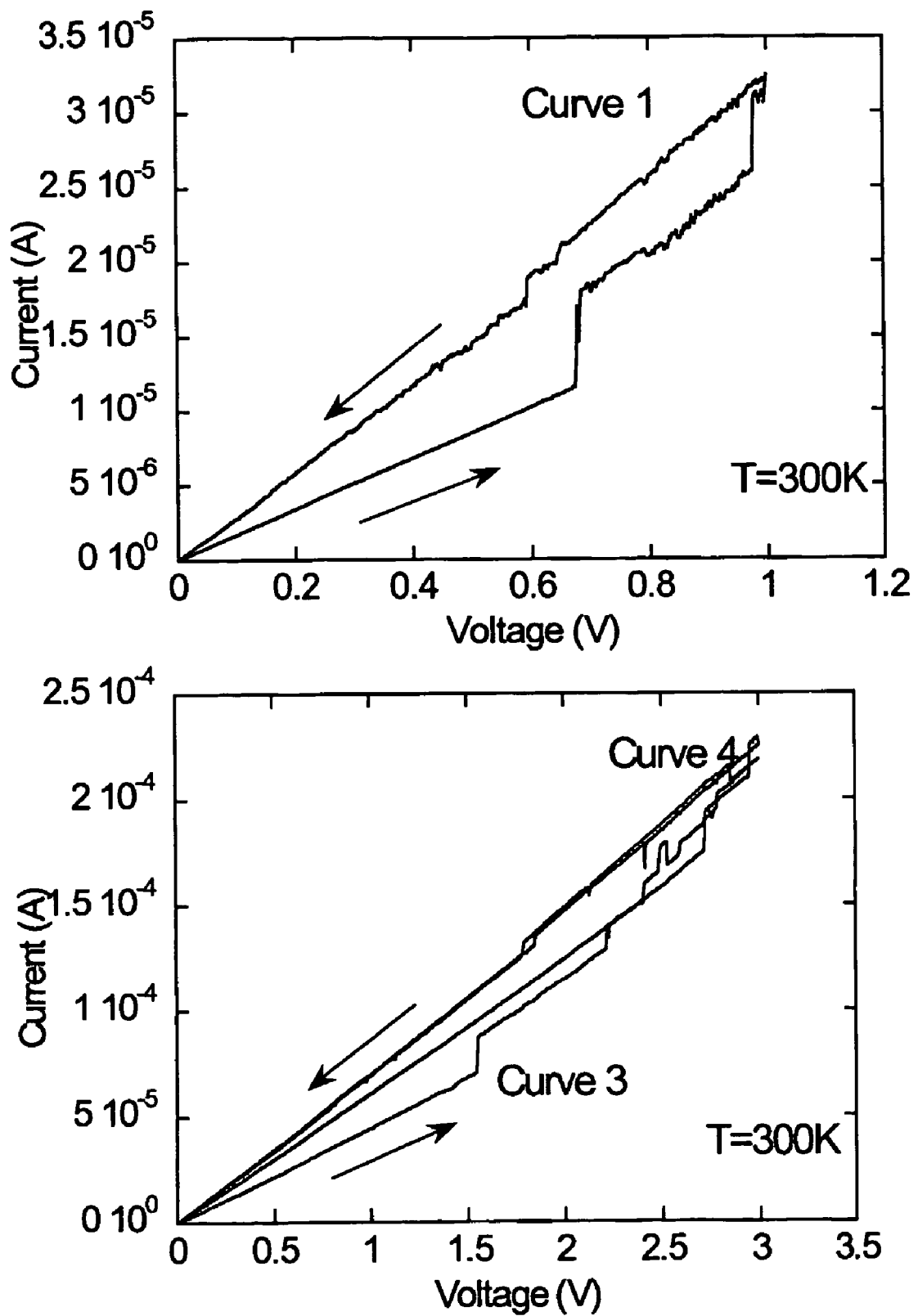
FIG. 25. Current—Voltage characteristics for a bismuth cluster film at room temperature, showing linear low voltage behaviour and steps in the resistance at higher voltages.
Figure 27:
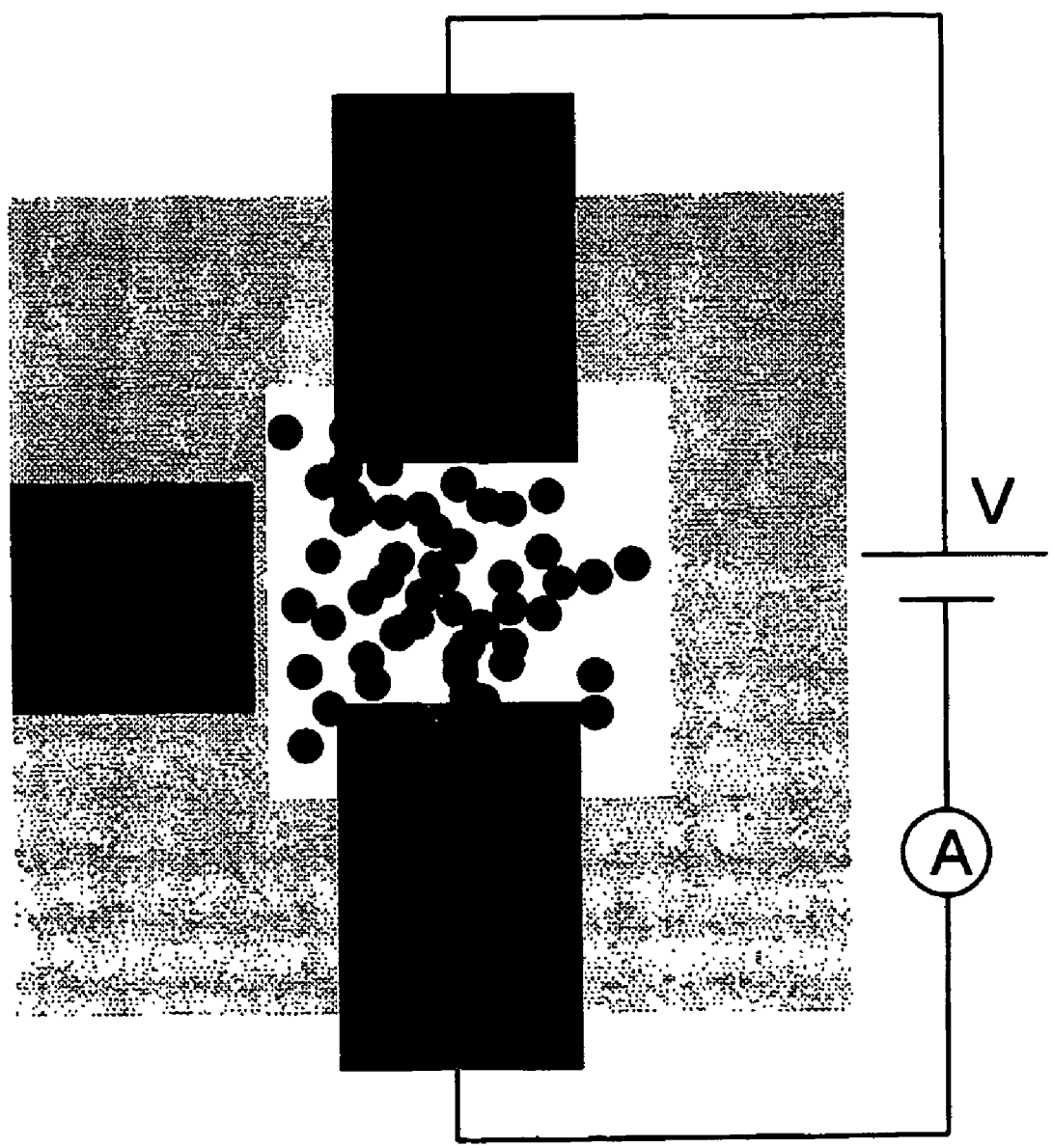
FIG. 27. Schematic illustration of a device part of which has been coated with an insulating layer.
Figure 32:
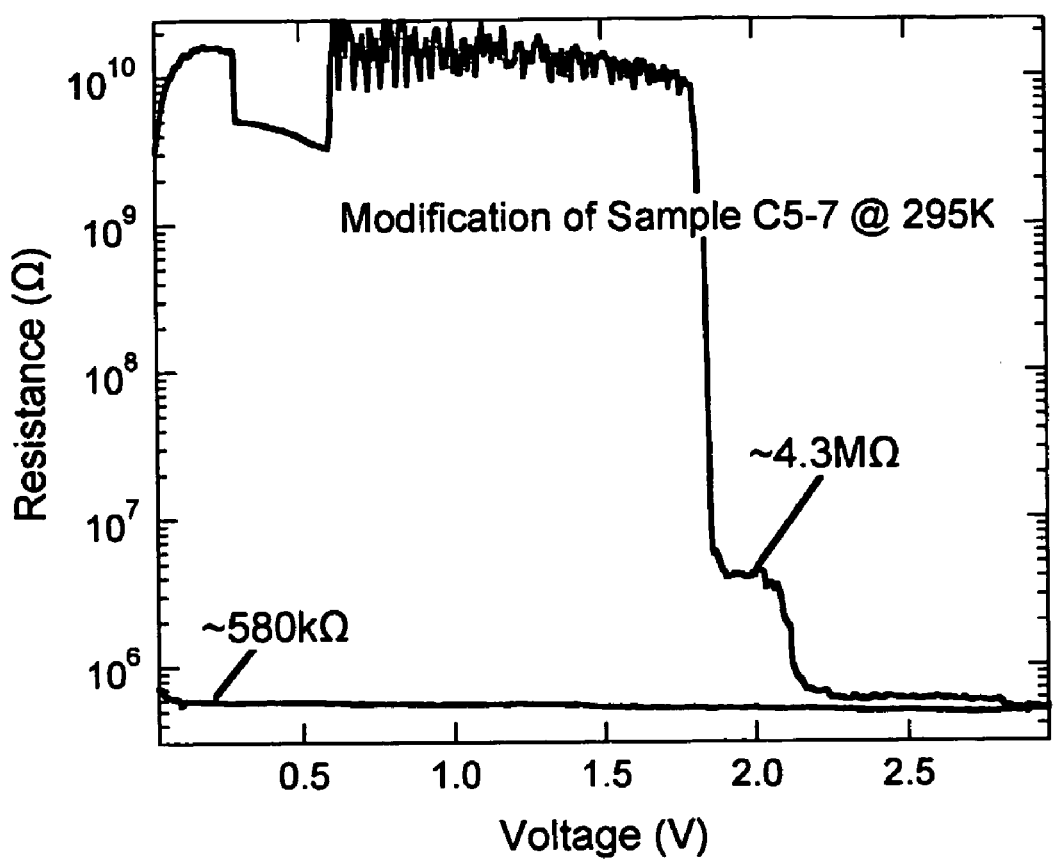
FIG. 32. Resistance versus voltage data showing the modification of a cluster film by an applied voltage/current.

The abovementioned list of possible applications may be embodied in a number of different ways, specific examples of these include the following (which are included within the scope of the invention):

i) A device in which the contacts are arranged such that the separation between the contacts, L, is smaller then the width of the contacts, w; ideally w>>L as defined in the Definitions section, and as shown in FIGS. 1 and 13. Deposition of clusters or nanoparticles onto contacts arranged in this manner achieves (in a simplified picture) an averaging over a large number of L×L squares, in each of which there is a stochastic distribution of nanoparticle structures. In a single square the onset of conduction occurs at a coverage that cannot be determined in advance i.e. the onset of conduction is determined probabilistically (FIGS. 8 and 17). The described contact arrangement intrinsically averages over many such squares, so that it is possible to ensure that the onset of conduction occurs at a relatively low coverage, thus achieving a structure which includes a chain of clusters similar to that shown in FIG. 1, or a network of clusters with a narrowest point that includes a single cluster or chain of clusters similar to that in FIG. 11. This device and each of the devices described below may work in an AC or DC or pulsed mode.

ii) A larger device consisting of two or more of the devices described in 1, either to better control the deposition process, or to define a better or differently functioning device, or where one or more of the devices is used to control the film thickness in one or more of the other devices. FIG. 7 is such an example wherein a double contact arrangement and measurement circuit (Top) is illustrated. This is used to observe percolation thresholds during the same experimental run (bottom). The resistor R (~10 Mohm) limits the current through the contacts with smaller spacing, allowing the second onset to be observed.

iii) By monitoring the onset of conduction in one of the devices (using a picoammeter or other current measuring device), for example with a contact separation $L_1$, and controlling the deposition with a shutter, the surface coverage in a second device with a different contact separation $L_2$ can be controlled. A high degree of precision, together with local, real-time monitoring, is not usually available in deposition rate monitors and so these devices provide a unusually sensitive monitor of the film thickness at the monolayer and sub-monolayer level. In the case $L_2 > L_1$ this technique will result in a controlled surface coverage (film thickness) in the second device, even though the device is not yet conducting (i.e. below the percolation threshold the clusters do not form a connection between the contacts). By careful choice of $L_1$ it will be possible to form a connected path or to form an unconnected path between the second pair of contacts. Note that due to a broadening of the percolation threshold due to finite size effects, the percolation threshold and therefore the onset of conduction in L×w systems, will move to smaller coverages when the separation between the contacts is small i.e. when the ratio of the size of the contacts to the size of the particles being deposited, or which are formed by aggregation or diffusion on the surface, falls below about 100. This is illustrated in FIG. 5 in which the normalized critical film thickness $d_C(L)/d_C(\infty)$ is shown as a function of system size L (contact separation). The equation $\gamma t_C(L)/t_C(3200 \text{ nm}) - 1 \propto L^{-z}$ is fitted to the experimental data; $\gamma = t_C(3200 \text{ nm})/t_C(\infty)$ and z are the fitted parameters; the plotted data are $t_C(L)/t_C(\infty) \equiv d_C(L)/d_C(\infty)$.

iv) A device as described in 1 in which two or more contacts of equal or unequal separation are arranged in any pattern and where the contacts are of any shape including interdigitated, regular or irregular arrangements. An interdigitated arrangement of contacts, illustrated in FIG. 4., has been used extensively in our work to this point, as it provides a compact geometry which performs the averaging described in 1 and 2. FIG. 4 illustrates a double contact arrangement at 50 times magnification showing bonding pads defined by optical lithography (left) and 1000 times magnification showing interdigitated contact arrangements defined by EBL (right). Separation between the contacts is 800 nm (top) and 3200 nm (bottom). However it will be appreciated that a square or rectangular space or space of any other shape between the contacts may also be used.

v) FIG. 14 shows a basic 3 terminal device with a network of clusters that allow a current to be passed between 2 contacts (labelled source and drain). By making the distance G large (i.e. bigger than the source drain separation) it is possible to increase the probability that the film is not connected to the third contact, which can then be used to control the current flowing. The probability of a connection between any pair of contacts can be determined by changing the contact spacing and geometry. The device is similar to a field effect transistor (FET): the voltage applied to the gate attracts (repels) electrons from the connected path thereby increasing (decreasing) the conductivity of the chain of clusters, and turning the device on (or off).

vi) FIG. 15 shows a 4 terminal device where the spacing between the four contacts is similar. It will not be known in advance which of the contacts will be joined by the first chain of clusters that forms. However, once a chain is formed, in this case between contacts 1 and 3, and the onset of conduction is observed during in-situ monitoring, the contacts acting as source and drain (1 and 3 in this case) and those acting as gates (2 and 4 in this case) can be determined by interrogating the contacts electrically. The resulting structure is essentially that of an FET.

vii) In FIG. 15, if contacts 2 and 4 are made of a material that does not form an ohmic (i.e. conducting contact) to the network, those contacts will be predetermined as gates, and contacts 1 and 3 as source and drain. In this example contacts 2 and 4 might be made from a material which is known to form a Schottky contact to the cluster network, or from a material like aluminium or silicon which has been oxidised to form a tunnel barrier. In this example, the function of the contact pads can be determined prior to deposition.

viii) As shown in FIG. 27, it is possible to create an oxide or other insulating layer on the substrate and then use lithographic techniques so as to define an area such that only clusters landing in that area participate substantially in the cluster network formed. FIG. 27 provides a schematic illustration of a device (the same one as illustrated in FIG. 9, but the same principle applies to all devices) part of which has been coated with an insulating layer (the lighter central region) so that clusters landing in that region are not connected to the electrical contacts. Only clusters landing the window (region not coated in oxide) can connect to the top and bottom contacts. In this way devices may be isolated from one another and the function of the contacts can be pre-determined. In this illustration the insulating coating covers the gate contact isolates it from the cluster film. Isolation of a contact could also be achieved by making it of a material (such as aluminium) which oxides naturally. This technique can be used to pre-determine the function of one or more contacts to be gates or ohmic contacts.

ix) Any of the devices described above which are covered entirely or partially by an oxide or other insulating layer and incorporating a top gate to control the flow of electrons through the cluster assembled structure, thereby achieving a field effect transistor or other amplifying or switching device, as shown in FIG. 30.

x) Any of the devices described above which are fabricated on top of an insulating layer which itself is on top of a conducting layer that can act as a gate, which can control the flow of electrons through the cluster assembled structure, thereby achieving a field effect transistor or other amplifying or switching device.

xi) Any of the devices described above in which switching or amplifying based on spin transport is achieved, thereby producing in a spin valve transistor.

xii) The devices may be fabricated with bismuth clusters, or equally well from any type of nanoparticle that can be formed using any one of a large number of nanoparticle producing techniques, or from any element or alloy. Bismuth clusters are particularly interesting because of the low carrier concentration and long mean free paths for electrons in the bulk material. Other obvious candidates for useful devices include silicon, gold, silver, and platinum nanoparticles. The devices could also be formed from alloy nanoparticles such as GaAs and CdSe. The nanoparticles are formed from any of the chemical elements, or any alloy of those elements, whether they be super-conducting, semi-conducting, semi-metallic or metallic in their bulk (macroscopic) form at room temperature. The nanoparticles may be formed from a conducting polymer or inorganic or organic chemical species which is electrically conducting. Similarly either or both of the contacts and/or the nanoparticles may be ferromagnetic, ferromagnetic or anti-ferromagnetic. Two or more types of nanoparticle may be used, either deposited sequentially or together, for example, semiconductor and metal particles together or ferromagnetic and non-magnetic particles together. Devices with magnetic components may yield 'spintronic' behaviour i.e. behaviour resulting from spin-transport. Spin-dependant electron transport across sharp domain walls within the wire [29] or between the wire and contacts can yield large magneto-resistances which may allow commercial applications in magnetic field sensors such as readheads in hard drives.

xiii) Any of the devices described above in which the film of clusters includes fractal, snowflake or other non-uniform structures, including regular or irregular arrays of particles. Such structures can be assembled between the contacts by surface aggregation or diffusion of particles across the surface of the substrate (see for example Refs [11,12,13.4] which discuss diffusion of particles on surfaces). As with all other devices described herein, the temperature of the substrate can be controlled during the deposition process in order to control the diffusion of particles, fusion of particles or for any other reason. In general, smooth surfaces and high substrate temperatures will promote diffusion of particles, while rough surfaces and low substrate temperatures will inhibit diffusion. The fusion and diffusion of nanoparticles is material dependent.

xiv) Any of the devices described above in which a voltage is applied between the contacts during deposition such that a flowing current modifies the connectivity of the particles, the conductivity of the device, or the film morphology. Such an applied voltage may allow a conducting path to be formed between the contacts at surface coverages where no connection would usually exist (see FIG. 32 which shows a dramatic onset of conduction under applied bias), or conversely, to cause the disruption of a previously existing conducting path. FIGS. 24 and 25 show ohmic low voltage behaviour and a range of more modest steps at higher biases. A resistor, diode, or other circuit element connected in series or in parallel with the device can be used to regulate the current flowing so as to control the modification of the films properties.

xv) Any of the devices described above in which the film is buried in an oxide or other non-metallic or semi-conducting film to protect it and/or to enhance its properties (see for example FIG. 30), for example by changing the dielectric constant of the device. This capping layer may be doped by ion implantation or otherwise by deposition of dopants in order to enhance, control or determine the conductivity of the device.

xvi) Any of the devices described above in which the film has been annealed either to achieve coalescence of the deposited particles or for any other reason.

xvii) Any of the devices described above in which the assembly of the nanoparticles is influenced by a resist or other organic compound, whether it be exposed, developed washed away either before or after the deposition or aggregation process.

xviii) Any of the devices described above in which the assembly of the nanoparticles is controlled or otherwise influenced by illumination by a light source or laser beam whether uniform, focussed, unfocussed or in the form of an interference pattern.

xix) Any of the devices described above in which the particles are deposited from a liquid, including the case where the particles are coated in an organic material or ligand.

xx) A TeCAN device where the connectivity of a particular pair of contacts is determined by surface texturing techniques, for example, by using V-grooves (see FIG. 28) between the contacts to guide the clusters into wire-like structures along the V-groove (see FIG. 29), and to disrupt connections in a perpendicular or other direction. FIG. 16 shows a device in which V-grooves running between contacts 1 and 3 (largely obscured by the clusters which accumulate in the valleys) cause contacts 1 and 3 to act as ohmic contacts to the cluster wires formed, and cause contacts 2 and 4 to be isolated from the wires so that they can act as gates (the crests of the V-grooves are represented by dashed lines and the valleys of the V-grooves by solid lines).

xxi) A further preferred embodiment of the device described in xx) includes only a single V-groove, and thus creates a single nanowire (FIG. 29). Nanoclusters can diffuse across a substrate and then line up at certain surface features[11,12], thus generating structures resembling nano-scale wires. Nano-scale surface texturing techniques (for example v-grooves etched into the surface of a Si wafer [30], pyramidal depressions or other surface features) will force clusters to assemble into nano-scale wires. Diffusion of mobile clusters on the surfaces of the v-groove should cause the formation of a chain or wire at the apex. The concept is that expensive and slow nanolithography processes (the 'top-down' approach) will be used only to make relatively large and simple electrical contacts to the device, and possibly for the formation of the v-grooves. Self assembly of nanoscale particles (the 'bottom-up' approach) is then used to fabricate the nanoscale features. At the heart of the devices is the combination of 'top down' and 'bottom up' approaches to nanotechnology.

xxii) Further preferred embodiments of the devices described in xx) and xxi) include such devices with an contact arrangement which allows ohmic contact to the nanowire formed in the bottom of the V-groove or inverted pyramid. Many such configurations can be envisaged, including single metallic contacts at each end of the V-groove (as in FIG. 29), interdigitated contacts perpendicular to the V-groove, as well as metallic contacts at each corner of an inverted pyramid (See FIG. 31).

xxiii) A device which has several contacts or ports and which relies on ballistic or non ballistic electron transport through the nanoparticles and which relies on the effect of a magnetic field to channel the electrons into an output port which was not the original output port in a zero magnetic field, or which relies on any magnetic focussing effect.

xxiv) Any of the devices described above which are formed by deposition of size selected clusters or, alternatively, which are formed by deposition of particles that are not size selected.

xxv) Any of the devices described above which are formed by deposition of atomic vapour, or small clusters, and which results in nanoparticles, clusters, filaments or other structures that are larger than the particles that were deposited.

D. Experimental

The following discloses our preferred experimental set up along with specific examples.

a) Lithography

According to computer simulations, size dependent effects are strong in the region L=5 to L=80, where L is the number of clusters that fit between the contacts. The average size of the bismuth clusters available was about 60 nm, therefore contact separations as low as 300 nm had to be realized. Standard optical and electron beam lithography has been used to define NiCr and Au contacts on a non-conducting and very flat SiN surface. A commercial silicon wafer with a 200 nm SiN insulating layer is used as the substrate. Firstly large area NiCr and Au contact pads were defined using standard optical lithography techniques, and then NiCr contacts with separations from 300-3200 nm were defined using electron beam lithography.

In FIG. 4 optical microscope images of the contact arrangements are shown. The contacts are arranged in an interdigitated finger pattern because this geometry allows a large length to width ratio in a given area.

b) Cluster Formation

Ionised clusters and/or a mass selection system may be used in a deposition system, for example incorporating a mass filter of the design of Ref [31] and cluster ionisation by a standard electron beam technique. A feature of our deposition system (that is not typically incorporated into most vacuum deposition systems, such as the design of Ref. 27) is the use of electrical feedthroughs into the deposition chamber, to allow electrical measurements to be performed on devices during deposition. Such feedthroughs are standard items supplied by most companies dealing in vacuum equipment.

Our preferred apparatus is a modified version of the experimental apparatus described in Ref. [32]. Bismuth clusters are produced in an inert-gas condensation source. In the source chamber, the metal is heated up and evaporated at a temperature of 850 degrees Celsius. Argon gas at room temperature mixes with the metal vapour and the clusters nucleate and start to grow. The cluster/gas mixture passes two stages of differential pumping (from ~1 Torr in the source chamber down to ~$10^{-6}$ Torr in the main chamber) such that most of the gas is extracted. The beam enters the main chamber through a nozzle having a diameter of about 1 mm and an opening angle of about 0.5 degrees. At the sample the diameter of the cluster beam is about 4 mm. In order to determine the intensity of the cluster beam, a quartz crystal deposition rate monitor is used. The samples are mounted on a movable rod and are positioned in front of the quartz deposition rate monitor during deposition.

Note that the specific range of source parameters appears not to be critical: clusters can be produced over a wide range of pressures (0.01 torr to 100 torr) and evaporation temperatures and deposited at almost any pressure from 1 torr to $10^{-12}$ torr. Any inert gas, or mixture of inert gases, can be used to cause aggregation, and any material that can be evaporated may be used to form clusters. The cluster size is determined by the interplay of gas pressure, gas type, metal evaporation temperature and nozzle sizes used to connected the different chambers of decreasing pressure.

(c) Measurement During Deposition

The core of the measurement circuit was a Keithley 6514 Electrometer with a resolution of $10^{-15}$ A. Therefore, the limiting factor for the current resolution is the noise in the system. A current independent voltage source with an output voltage of 1.21V supplied the required stable potential.

The measurement of the current flowing in the device during deposition is important to the realisation of several of the device designs.

(d) Percolation Theory: Calculations of the Probability of There Existing a Cluster Network that Spans the Contacts and Conductivity of a Percolating Network A simple model of a cluster deposited film is a two dimensional square lattice where a random fraction p ($0 \leq p \leq 1$) of the available lattice sites are occupied. The number, size and shape of the connected structures are described by Percolation Theory[33]: in an infinite system the structures generated by connecting neighbouring occupied lattice sites will be small and isolated for $p<p_C$ and form an infinite network for $p>p_C$, where $p_C=0.5927461$ is the percolation threshold. At the critical coverage $p_C$ a geometrical second order phase transition occurs with power-laws and corresponding critical exponents describing the behaviour of quantities such as the correlation length, probability of finding an infinite structure and conductivity. According to the universality hypothesis [34], the critical exponents depend only on few fundamental properties of the respective model (dimension, kind of interaction) and therefore estimates for the critical exponents obtained from very simple models can apply to more complex or experimental systems.[35] Even though the clusters in the experiment do not land on a square grid and are of non-uniform sizes, the Universality Hypothesis (and indeed substantial simulational literature) indicate that our simple simulations (uniform clusters, square grid) yield the same values for many of the critical quantities, including the threshold exponent for the correlation length ν, which determines the shift in $p_{onset}(L)$. [However some other parameters such as the threshold exponent for the conductance t, are found to vary depending on the model [$\sigma(p) \propto (p-p_c)^t$]].

The probability of the existence of a cluster network that spans the contacts, ψ(p), and the conductivity of a cluster deposited films have been calculated using computer simulations. The probability ψ(p) is calculated by simulating a film with a coverage p a large number of times and then counting the simulated configurations which span the contacts. The conductivity is calculated by assigning resistances to each occupied lattice site and then calculating the resistance of the entire network of resistors.

As an illustration FIG. 1 shows schematically a rectangular sample with separation between the contacts L and width of the contacts w>>L (L and w measured in lattice spacings). The contacts are attached to the long sides of the rectangle so e.g. for L=5 only 5 lattice sites fit between the contacts. Rectangular rather than square arrays have been studied because of the stochastic nature of the process under consideration. For small systems, statistical fluctuations become increasingly significant and so an estimate of the expectation value for any quantity can only be obtained by averaging over many independent samples. While averaging over a large number of samples is possible in simulations, it is impractical in experiments due to time limitations and the difficulty in producing identical experimental conditions over a large number of runs. Our rectangular structures, however, intrinsically average over w/L squares, allowing the collection of data with small statistical error in one single deposition.

FIG. 21 shows plots of probability of percolation as a function of coverage for various L×w rectangular systems. These are the results of computer simulations of ψ(p) for various L×w systems which have similar dimensions to the samples used in our experiments (see Table 1). Finite-size effects í are very pronounced, i.e. for smaller contact separation L cluster networks that span the contacts can be found at a lower coverages.

TABLE 1

Dimensions of the samples used in the experiments and those used in the simulations. These figures are based on a maximum dimension of 33 microns for the square area containing the interdigitated fingers and a mean cluster size of 60 nm.

| Actual sample dimensions | | | Dimensions used in simulations | | |
|---|---|---|---|---|---|
| Contact separation (nm) | L (sites) | w (sites) | Contact separation (nm) | L (sites) | w (sites) |
| 300 | 5 | 29150 | 300 | 5 | 29150 |
| 400 | 6.666667 | 21587.5 | 420 | 7 | 20500 |
| 800 | 13.33333 | 10243.75 | 780 | 13 | 10500 |
| 1600 | 26.66667 | 4571.875 | 1620 | 27 | 4500 |
| 3200 | 53.33333 | 1735.938 | 3180 | 53 | 1750 |

Figure 2:
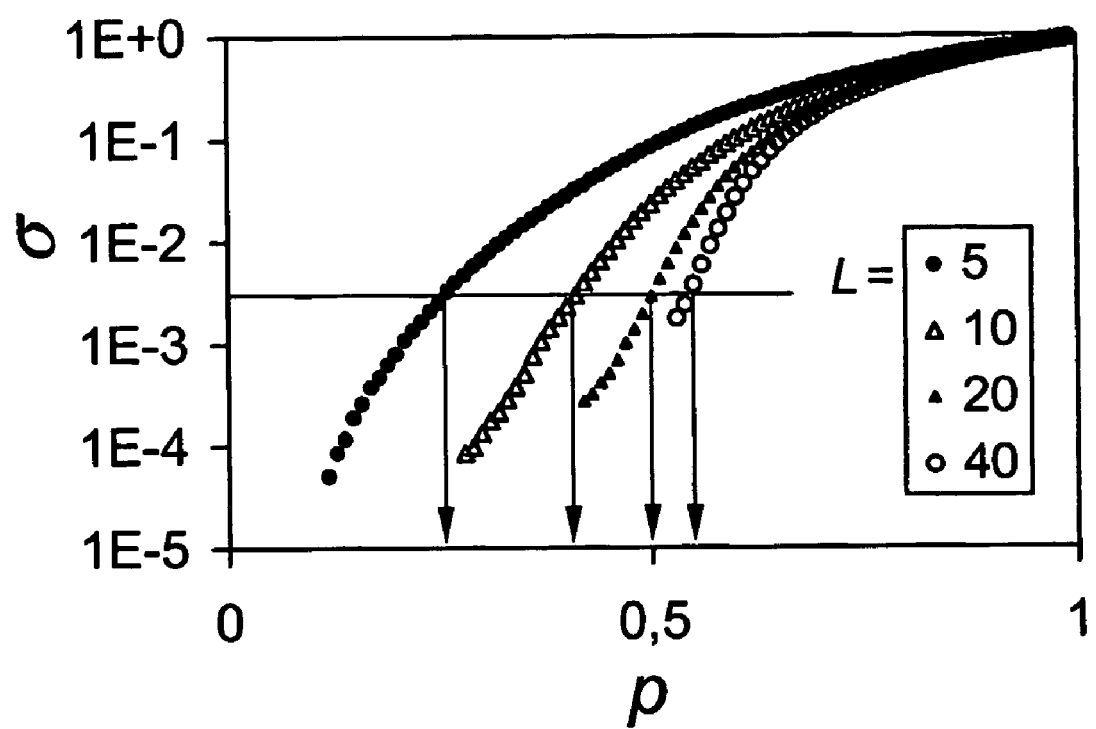
FIG. 2: Normalized conductivity as a function of p for 4 different system sizes L.

FIG. 2 shows results of computer simulations of the conductivity ó (normalized per unit square) as a function of coverage p and contact separation L (for very large w), for 4 different system sizes L. The horizontal line indicates a particular choice of minimum observable conductivity $\sigma_{min}$ and the arrows point to the corresponding $p_{onset}$ values for each system size as described in the main text.

Finite-size effects in the conductivity are very pronounced, i.e. for smaller contact separation L conduction can be measured at a much lower coverage. Finite-size scaling theory [31] suggests that all finite-size deviations can be accounted for by the following scaling ansatz:

$$ó(p,L)=L^{-t/í}f_ó((p-p_C)L^{1/í}), \quad (1)$$

and this is indeed the case for our data ($f_ó$ is a suitable scaling function, t the critical exponent for the conductivity and í the critical exponent for the correlation length).

In the experiment the effective percolation threshold $p_{onset}$(L) can be defined in several ways. A standard method is to define $p_{onset}$(L) to be the coverage at which the probability of percolation, ψ(p), reaches a certain level (e.g. 0.5). If we simulate L×w systems of dimensions similar to the actual samples used in the experiments we can obtain ψ(p) data [FIG. 21] and $p_{onset}$(L) data [FIG. 23 shows data for ψ(p)=0.5]. FIG. 23 shows that the relation $$p_{onset}(L)-p_C \propto L^{-z} \quad (2)$$

which is predicted for simple L×L square systems, holds in the rectangular geometry of our samples, with an exponent z=1/í.

Figure 3:
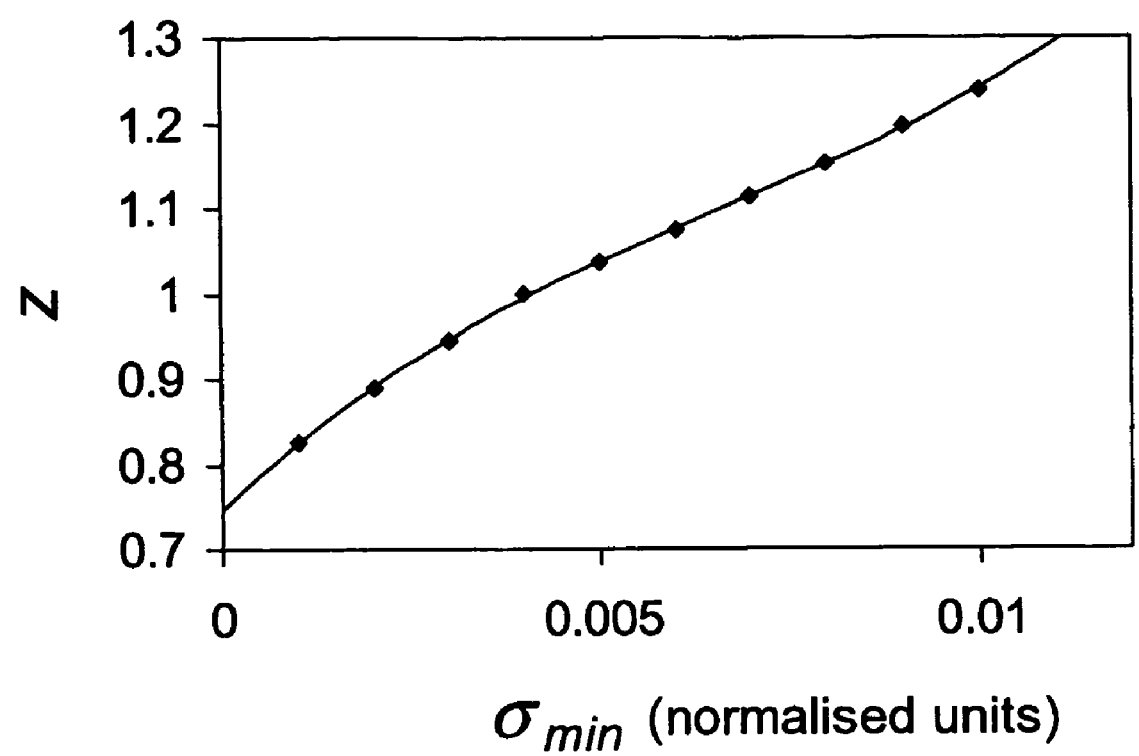
FIG. 3: Scaling exponent z for the effective percolation threshold $p_{onset}(L)$ as a function of the minimum observable conductivity $\sigma_{min}$.

Another method is define $p_{onset}$(L) to be the coverage at which the conductivity reaches the minimum conductivity $ó_{min}$ measurable by the ammeter. To allow direct comparison with the experiment, we prefer to use the same definition in the simulation. The effective percolation threshold then depends on the choice of $ó_{min}$ as well as the system size L, as illustrated in FIG. 2 for systems with large w. Using Eq.(1), it can be shown that in the limit of small $ó_{min}$, a scaling relation of the form of equation (2)holds, with z=1/í (where í=4/3 for two-dimensional lattices). The simulational results can be used to confirm eq.(2) by calculating the exponent z as a function of $ó_{min}$. In contrast to the conventional definition of the percolation threshold for a L×w system [36] where z=1/v always, FIG. 3, Illustrates the scaling exponent z for the effective percolation threshold $p_{onset}$(L) as a function of the minimum observable conductivity $\sigma_{min}$. The solid line is a third order polynomial fit to the data: the fit intercepts the vertical axis at z=0.746±0.006 which is consistent with the expected critical exponent 1/í=0.75. This Figure shows that for our definition of the percolation threshold z 1/í only as $ó_{min}$ 0 i.e. in general z 1/í, and care must be taken to ensure (both in experiment and simulation) that a sufficiently small $ó_{min}$ is chosen.

We have also calculated for L×w systems of dimensions similar to the actual samples used in the experiments (see table 1). S(p) data for these realistic L×w samples are shown in FIG. 22, both on linear and logarithmic scales, and $p_{onset}$(L) data are plotted in FIG. 23 where they are compared against $p_{onset}$(L) data from the conventional definition of the percolation threshold (obtained from FIG. 21). In FIG. 23 $p_{onset}$(L) is defined in two ways. Diamonds represent the value of the coverage at which the probability of percolation is 0.5. Squares represent the coverage at which the conductivity reaches a value $\sigma_{min}=1\times10^{-3}$. $p_c$ is the coverage at which the percolation threshold occurs in an infinite system i.e. 0.5927461. The $p_{onset}$(L) data obtained with completely different methods give the same values of the exponent v=0.75. Note that the data at large L become relatively unreliable because the difference $p_{onset}$(L)–$p_c$ becomes very small—it would be necessary to average the simulational data over many more runs to obtain data with smaller statistical uncertainties.

An important result of the simulations, which are supported by experimental data discussed below, is that the percolation threshold shifts to coverages as low as 20% for suitably wide contacts (w) and narrow contact spacings (L). At the onset of conduction (i.e. near the effective percolation threshold) the coverage is so low that the conducting path must consist of a narrow chain of clusters similar to that illustrated schematically in FIG. 1 and in FIG. 11 i.e. a wire like structure is formed with a limited number of branches in the network of clusters neighbouring the narrowest part.

e) TeCAN—V-groove Formation

The following deals with the formation of the V-groove in the TeCAN variation of the invention.

Sample processing begins with dicing a nitride coated (layer thickness typically 100 nm) silicon wafer into 8×8 mm substrates. In order to accurately locate the orientation of the <111> plane, the nitride layer is initially dry etched through a photoresist mask to form radial slots separated by 2°. These slots are translated into V-grooves in the underlying silicon using 40% wt KOH solution. Once completed, angular alignment of the device V-groove arrays to the test slots (selecting those with the neatest etched profile) is performed through a further photolithographic and dry-etch stage. The V-groove array is formed using the same KOH solution.

Examples of a V-grooves and related structures formed in this way and imaged using atomic force microscopy are shown in FIGS. 28, 29 and 31. FIG. 28 is a atomic force micrograph of a V-groove etched into silicon using KOH. The V-groove is approximately 5 microns across is formed using optical lithography. One of the attractions of the technique is that it allows features to be readily scaled down in size, using electron beam lithography.

The specific cluster/substrate pair which is being used determines whether or not the surface of the V-groove needs to be coated with an insulating layer in order to provide insulation between the cluster assembled wire and the substrate. For some cluster/substrate combinations a Schottky contact will be formed, enabling limited isolation of the wire from the substrate. In some cases the native oxide layer on the substrate will provide sufficient isolation. If required, passivation of the V-grooves may be carried out in two ways. At present, the preferred method is to thermally oxidise the entire substrate immediately after forming the V-groove arrays. The alternative passivation method relies on sputter coated silicon nitride.

The contacts are formed using either optical or combined electron-beam/optical lithography stages. An initial evaporation and lift-off using an optical photoresist pattern leaves device fingers (>1 µm width) and contacts extending across the main 3×3 mm device area. Device fingers are located over the single or multiple V-grooves with sub-micron tolerance achieved using vernier alignment marks. Electron-beam patterning is used when sub-micron finger/gap widths are required and these features are aligned to pads created in the first optical lithography process. The final evaporation and lift-off allows large scale device contacts to be positioned at the edge of the 8×8 mm chip. FIG. 29 shows a schematic diagram of a preferred embodiment. It shows a schematic illustration of a cluster assembled nanowire created using an AFM image of a V-groove. The top and bottom contacts are aligned with the apex of the V-groove so as to make electrical contact to the cluster assembled nanowire, which results from diffusion of clusters along the flat faces of the V-groove. The left and right contacts are aligned with the edges of the V-groove so as not to make electrical contact with the cluster assembled nanowire, allowing these contacts to be used as gates. A transistor structure could also be achieved by fabricating a top gate on top of an insulating layer above the wire, as in FIG. 30, in which there is shown a side view of a FET structure fabricated by first deposition of an insulating layer on top of the cluster assembled nanowire followed by lithographic definitions of a gate contact. The nanowire may be formed using either PeCAN or TeCAN technology.

In a preferred embodiment, prior to cluster deposition the substrate will be passivated in order to isolate devices from each other. This can be achieved using a patterned sputter coated silicon dioxide layer. Optical lithography followed by dry etching can be employed to open windows in the silicon dioxide directly over the contact finger/V-groove areas. If thermal oxidation was used to passivate the silicon V-grooves, this final dry etch is timed to avoid significant depletion of the base oxide layer.

The sample is now mounted in a purpose made sample holder with all necessary device contacts, as per the procedure for PeCAN devices. In a preferred embodiment, after cluster deposition and whilst in high-vacuum, the devices can be sealed with an electron-beam evaporated insulating film (e.g. $SiO_x$). This layer can be used to prevent oxidation of the clusters or as an insulating layer prior to fabrication of a top gate through an additional lithography and metal evaporation stage. FIG. 30 shows a schematic diagram of such a device (V-groove not shown).

Finally, we note that TeCAN devices can take advantage of many forms of surface texturing and are not limited to V-grooves. FIG. 31 shows atomic force microscope images at two different resolutions of the bottom of an 'inverted pyramid'. Inverted pyramids are formed when etching silicon using KOH and a mask or window with circular or square geometry (rather than slots as described above). It is possible to achieve inverted pyramids with very small dimensions and extremely flat walls (as in the lower image in FIG. 31 where the ridges are due to the quality of the AFM image, and are not representative of the flatness of the surface). In a preferred embodiment electron beam lithography is used to define electrical contacts at each of the four corners of the inverted pyramid, thereby allowing 4 terminal measurements of a cluster assembled wire formed along the edges of the facets. Such 4 terminal measurements may be useful for precise conductivity measurements for, for example, magnetic field or chemical sensing applications. Top and/or bottom gates may also be applied to these structures.

EXAMPLES

The invention is further illustrated by the following examples:

1. Lithography Processes

A combination of optical and Electron Beam Lithography has been used. The first technique defines macroscopic bonding pads with a moderate separation of about 40 microns. Subsequently, EBL defines the fine structure of the two contacts. For optical microscope pictures of fabricated contacts see FIG. 4.

(a) Cleaving and Cleaning of the Substrate

The substrates for the contacts are flat, square silicon pieces cut out of a standard 0.55 mm thick wafer with a 200 nm Silicon-nitride layer on top to provide a virtually non-conducting and very flat surface.

After cutting the wafer into pieces of the required size, the substrates are cleaned. That is achieved by rinsing them first in Acetone then Methanol and finally IPA making intensive use of the ultrasonic bath. After the IPA the substrates are blown dry with $N_2$ and baked at 95 degrees Celsius for about 15 minutes before further processing.

(b) Optical Lithography

Optical lithography is a very well established procedure to define patterns of sizes down to 1 micron. A film of a UV-sensitive material (photo-resist) is spun onto the substrate, exposed with UV light through a suitable mask and developed. This process leaves a defined pattern of photo-resist material on an otherwise clean surface. The resist used for the optical lithography was the standard stock photo resist S1813 from the Shipley S1800 Photo-resist Series. It is spun onto the substrates at 4000 rpm for 60 seconds and baked for 25 minutes at 95 degrees Celsius. Subsequently the substrates are exposed with UV light (wavelength 430 nm) for 12 seconds, developed in MF320 Developer for about 35 seconds and rinsed in distilled water.

The first step in preparing the contacts is the definition of the relatively large contact pads, to which wires can easily be bonded. It is required that the two parallel sides of the contact pads are separated by 40±1 µm for at least 100 µm. This region, where the pads are close to each other, can, in principal, be as long as the substrate allows. However, due to a sometimes inhomogeneous cluster beam, it is possible that conduction occurs through the 40 µm gap before the less exposed, much finer gaps get connected, therefore the critical region should be as small as possible. To most easily achieve that goal, a suitably defined optical lithography mask would be the best solution. However, the best mask presently available only defines a long line of 40 µm width. In order to get pads as required, first the line of photo resist has been defined by normal optical lithography on the substrate and afterwards a fine paint brush has been used to cover the necessary additional parts of the substrate surface with resist.

After preparing a substrate this way, the bonding pads can be evaporated onto it. The reason for using gold for the pads is twofold. Firstly and mainly, gold gives good contrast for the subsequent alignment of the substrates during the Electron Beam Lithography and secondly, it is possible to bond wires to relatively thin layers of gold. Since gold itself does not stick too well to SiN it is necessary to deposit a 10-12 nm thick layer of NiCr first. The required thickness of the gold layer is about 50 nm.

After the evaporation the lift-off of the remaining resist (dissolving in acetone using the ultrasonic bath) removes all deposited metal except the contact pads.

(c) Electron Beam Lithography

The principle of the EBL process is very similar to optical lithography. The electron sensitive resist is a high molecular weight polymer (HMW PMMA). The chains of the polymers break up on exposure to electrons and form regions of low molecular weight polymer (LMW PMMA) which can be dissolved without destroying the remaining HMW PMMA structures. Therefore it is possible to define patterns with dimensions as small as the minimum size an electron beam can be focussed to after taking into account effects like charging of the underlying surface and backscattering of electrons, which limit the resolution. For a more effective application of that principle a two layer resist procedure has been adopted. It consists of spinning a solution of 4% LMW PMMA onto the substrate first, followed by a layer of 2.5% HMW PMMA. (In both cases the PMMA solution is spun at 3000 rpm for 60 seconds and baked for 30 mins at 185 degrees Celsius. That results in both layers being about 200 nm thick.)

After preparing the resist, the substrates are exposed to an electron beam. For that, a modified Philips Scanning Electron Microscope (SEM) has been employed. The patterns can be defined in a 4096×4096 pixel arrangement in the form of adjacent or overlapping rectangles. By choosing an appropriate SEM magnification, different sized areas of the substrate can be exposed. The patterns are exposed by focusing the electron beam onto a spot (diameter 160 Å) and scanning over the appropriate pixels, dwelling on each pixel for a certain time. The dwell time is automatically calculated from the beam current arriving at the substrate, the exposure dose and the magnification.

As discussed in detail elsewhere in this application, establishing an electrical connection between two contacts by randomly placing conducting particles between them is a statistical process. In order to obtain meaningful and reproducible data, averaging over many of such connections is essential. One way of doing that is to design the contacts such that the gap between them has the form of a rectangle with its width (the separation between the contacts) being much shorter than its length. Interdigitated fingers allow for an even higher length to width ratio in a given area. For the implementation of such patterns for different contact separations see FIG. 4.

The resulting contact separations have to be measured using the Atomic Force Microscope (AFM) with the accompanying controlling and analysing software Nanoscope III Version 4.42r4 to determine the actual contact separation.

Aligning the writing region of the electron beam with the appropriate region of a substrate is straightforward—due to the good contrast of the gold pads even through two layers of PMMA. One possible problem arises from the exposure of the substrate during the alignment. The visual information in an SEM is generated by electrons hitting the surface of the substrate. Since it is impossible to align the electron beam accurately without "looking" at the critical region, this region will be exposed before the actual pattern writing commences. But if those exposures are restricted to short times and low magnifications the additional electron exposure does not influence the quality of the patterns.

After exposing the HMW PMMA it has to be developed. The developer is actually a solvent: MIBK (4-Methyl-2-pentanone):IPA in a ratio of 1:3. Its reactivity is highly temperature dependent, so the developing time of 30 s is applicable for a temperature of 23 degrees Celsius after which the substrate is rinsed in pure IPA. This process removes the exposed regions in both PMMA layers and undercuts the pattern which has been written into the HMW PMMA layer by dissolving a slightly larger area of the underlying LMW PMMA. This makes the later lift-off much easier and more successful especially with the finer patterns. However, the development process does not clear the SiN surface completely from pieces of resist and so an evaporated metal film would not stick very well. To solve that problem, the substrates are cleaned in an oxygen plasma shortly before the evaporation for 15 seconds with the RF field having an energy of 500 Watts. That removes organic layers of about 5 nm, which is enough to clean the free SiN surface but does not destroy the HMW PMMA film. At that stage the remaining PMMA layers should cover the substrate completely except for the very small exposed region in the centre. However, those layers are very sensitive to scratching or other mechanical stresses during the handling of the substrates and some small holes or cracks in the PMMA layer can develop. In order to avoid small metal deposits on various regions of the substrate, the whole substrate can be painted with the optical photoresist (sparing, of course, the centre region).

For the final evaporation of the fine contacts NiCr (80% Ni and 20% Cr) was chosen because it was readily available and more importantly sticks very well to SiN and forms a very hard film already at very low thicknesses. Due to that the final lift-off works quite reliably by dissolving the PMMA in Acetone and using the ultrasonic bath and as a possible additional means a piece of cotton to remove all bits of metals between the fingers. However, especially for the smaller contact separations it is sometimes impossible to remove all metal between the fingers. In such a case the substrate has to be discarded.

2. Results of Cluster Deposition Experiments

As a first step, Bismuth clusters were deposited on plain SiN surfaces and the resulting films were investigated using Atomic Force Microscopy. In FIG. 9 there are shown atomic force micrographs for increasing cluster coverages. Four depositions with increasing surface coverage are shown. The results from these investigations confirm that the Bismuth clusters behave very much like the model used in the simulations: they stick on contact to the surface and do not diffuse and coalesce as often observed for clusters of different smaller sizes and/or different materials [37].

Figure 19:
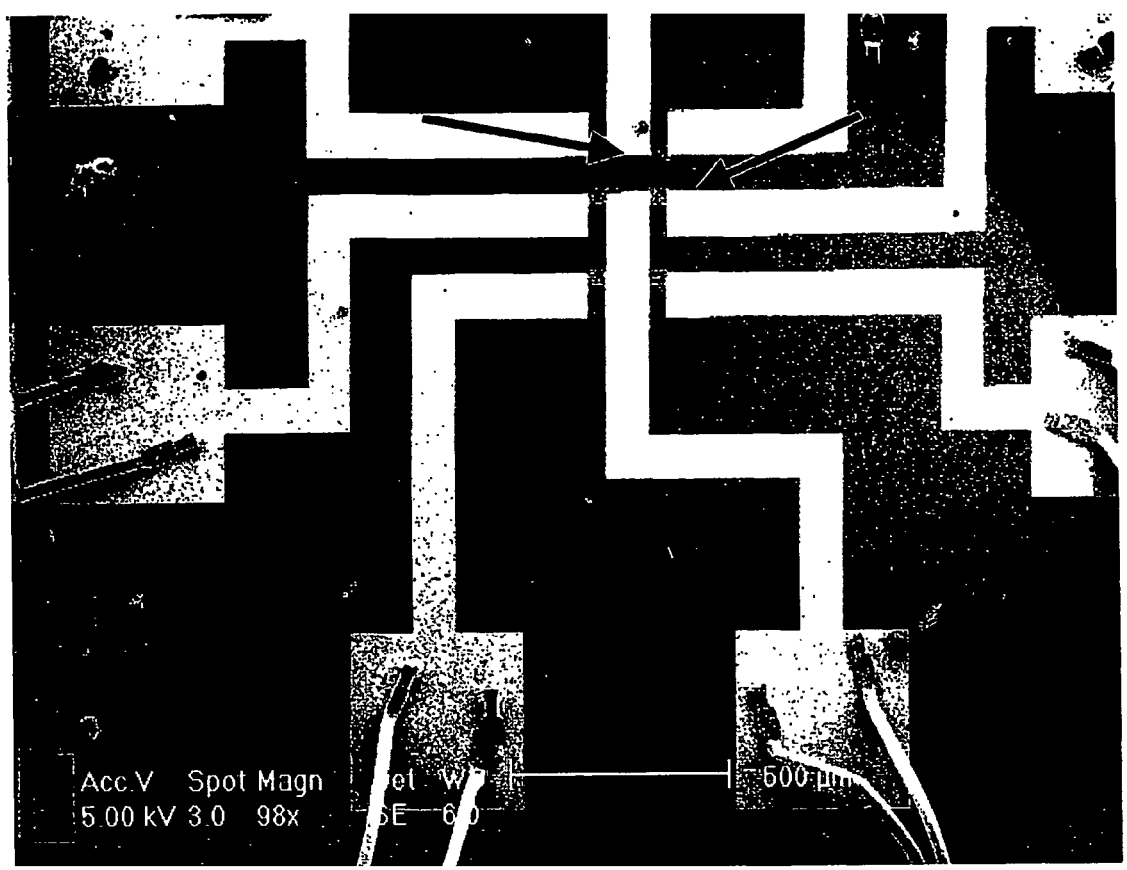
FIG. 19. Field Emission SEM image at low resolution of a sample with 6 pairs of interdigitated contacts covered in a film comprising 20 nm Bi clusters.

In addition we have use field emission scanning electron microscopy to investigate cluster films deposited onto samples with lithographically defined contacts. FIG. 19 shows a field emission SEM image at low resolution of a sample with 6 pairs of interdigitated contacts covered in a film comprising 20 nm Bi clusters. Note the shape of the spot resulting from the molecular beam and a circular aperture above the sample. Note also the gradient in the density of particles across the film. (In this case a strong shift in the percolation threshold is not expected because the smaller than usual clusters mean that L is relatively large).

Figure 20:
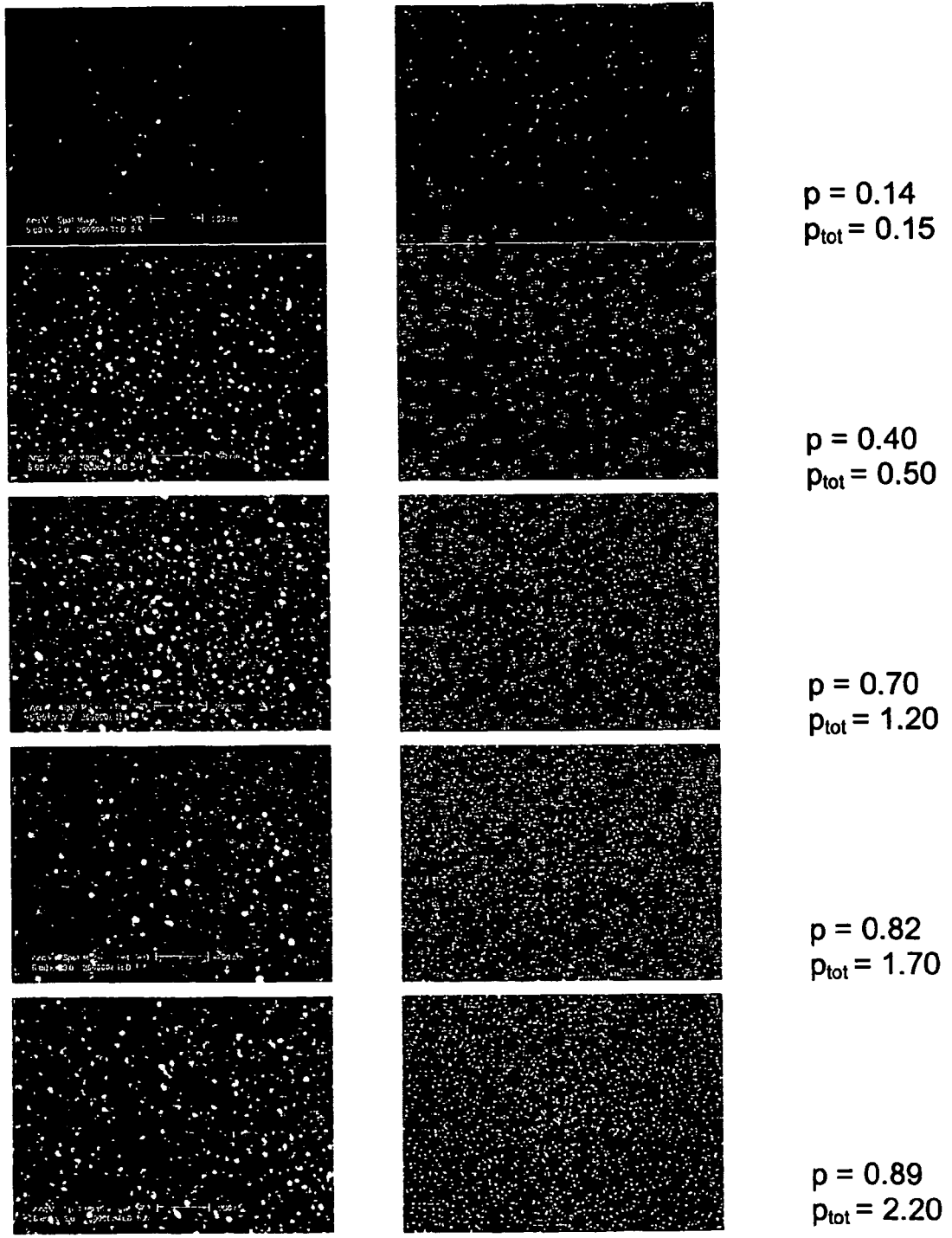
FIG. 20. Field emission SEM images of percolating cluster films compared with the results of simulations (continuum model).

FIG. 20 shows field emission SEM images of percolating cluster films compared with the results of simulations (continuum model). The simulations performed for the values of total coverage ($p_{tot}$) indicated. Since the total coverage is related to the coverage in the first layer by $p_{tot}=-\ln(p)$ the equivalent coverage in the first layer can be calculated. These images are of a number of areas of the sample with different film thicknesses (note that in FIG. 19 the cluster film is clearly not of uniform thickness). The morphology and connectivity of the cluster films are clearly very similar to the images generated by a simple computer program which randomly places particles on a surface [continuum percolation]. In this model the probability that a new particle landing on the surface actually lands on top of a particle that landed previously is simply the surface coverage, p. It is then a straightforward exercise to show that the total coverage including particles in higher layers is $p_{tot}=-\ln(1-p)$, where p is the coverage in the first layer only, as it was in the simpler single layer model. In this continuum percolation model, the percolation threshold for an infinite system occurs at p~0.68, which corresponds to $p_{tot}$~1.14 i.e. a total coverage 14% greater than that required to completely cover the surface if the clusters were confined to a single layer. Note however that at low coverage p~$p_{tot}$ and so the value of $p_{onset}(L)$ is not affected for L×w systems with sufficiently small L and large w.

The FE-SEM images also show that the smaller clusters do not diffuse and coalesce significantly. There is a limited amount of coalescence—the clusters merge very slightly into their neighbours—but in general the particles are still distinguishable.

During the first in-situ current measurement experiments, Bismuth clusters were deposited on single contact arrangements. A typical run consisted of generating and stabilizing the cluster beam to a given average cluster rate (using the deposition rate monitor) and exposing the contacts to the beam. During the exposure, the current was observed and the exposure time measured. Unfortunately, it was impossible to expose the deposition rate monitor and the contacts at the same time, although the average cluster beam intensity could be determined before and after the cluster deposition.

Generally, a sudden current jump over several orders of magnitude characterized the moment when the surface coverage (thickness of the film) was sufficient to connect the contacts (see FIG. 6). Unfortunately, some of the properties of the cluster beam are not ideally suited to our experiment. Most severely, the cluster beam intensity varies depending on the position in the beam, i.e. the intensity in the centre of the beam is highest and decreases outwards. Due to this problem, it was impossible to determine the cluster rate directly at the contacts which is necessary to compare different runs. In order to circumvent that problem, a new setup for the experiment was developed. The central idea was to use two contact pairs with different separations to be exposed simultaneously. As shown in FIG. 4 the two contact pairs are electrically isolated but located very close to each other (within a circle of 100 µm diameter). Therefore, the deviation in the cluster beam intensity from one contact to the other is negligible. Ideally, two picoammeters could now be used to measure the currents through the two contacts independently, however only one sensitive instrument was available. Hence, the two contacts were connected in parallel as shown in FIG. 7 (top). In series with the contacts with the smaller separation (which should show the earlier onset of conduction) a 10 GΩ resistor was placed and the total current through both contacts was measured. When the contacts with the smaller separation are connected by clusters, the current through this path is limited by the resistor. The total current increases further only after the film is thick enough to connect the second set of contacts. That way, the total current versus time curves should display a distinct plateau with its limits being the different onset times of conduction for the different contacts.

FIG. 7 (bottom) shows a typical experimental curve which demonstrates the predicted behaviour. Experiments have been performed for a set of samples where for each sample one set of contacts had the separation 3200 nm. Then it is straightforward to determine the critical film thickness x(L) normalized to the critical film thickness for separation 3200 nm:

$$x(L)=t_C(L)/t_C(3200 \text{ nm})$$

$t_C(L)$ denotes the onset time for the contacts with separation L. This equation implies that the ratio of the average deposition rates is assumed to be 1. That assumption would be true, if the cluster beam intensity was perfectly constant or, if it fluctuated around a constant mean value on a time scale much smaller than the deposition times. But in our system, the average beam intensity fluctuates on time scales of the order of the deposition times.

The critical film thickness $d_C(L)$ is plotted in FIG. 5 normalised by the critical film thickness for an infinite contact separation $d_C(\infty)$, which is a fitted parameter. The data is the experimental verification of the finite-size effects proposed by the simulations: the critical film thickness decreases with the contact separation. In the 2D square lattice, a coverage of about 60% of a monolayer leads to the infinite percolation cluster. In the Bismuth film about two monolayers may have to be filled to establish an infinite connection ($d_C(\infty)$~130 nm). This appear to result from a combination of several effects, of which the dominant ones are:

1) The finite probability that any cluster lands on top of another cluster, which leads to the relationship $p_{tot}=-\ln(1-p)$ previously discussed.

2) The likelihood that some fraction (ζ) of the bismuth clusters do not form electrically conducting connections to their neighbour(s), either because of a small gap or the existence of only a narrow neck between particles, or because they are oxidised by water or residual oxygen in the vacuum system.

If ζ~0.2 then a combination of the two effects leads to $p_{tot}$~2.0.

Results of some depositions show clear step-like behaviour of the conductivity versus time (FIG. 6). It seems clear that the steps result from the deposition of clusters at points in the network which dramatically influence the conductivity (current divided by the applied voltage, 1.2V) of the network as a whole. An extreme example of this is the initial onset of conductivity which must result from the landing of a single cluster, or small number of clusters, which complete the connection between the two contacts. In FIG. 6 the steps in the current beyond the threshold of conductivity result from changes in the current path due to the arrival of additional clusters in part of a network that connects the contacts.

Finally we have also investigated the conductivity using standard AC-lockin and I(V) techniques of a wide variety of samples prepared using different contact separations and coverages of bismuth particles with differing mean diameters.

Examples of the behaviour observed are given in FIGS. 24 and 25. FIG. 24 illustrates Current—Voltage characteristics for a bismuth cluster film at two temperatures, showing reproducible, linear low voltage behaviour. This Figure shows that at low voltages the I(V) curves are usually linear, indicating ohmic conduction. In comparison FIG. 25 illustrates current—Voltage characteristics for a bismuth cluster film at room temperature, with linear low voltage behaviour and steps in the resistance at higher voltages. This shows that at higher voltages new step like features in the conduction can be observed, some of which are reproducible over several voltage cycles and some not. Both increases and decreases in conductance are observed, although increases are more common. It appear that both connections and breakages between clusters can be induced by the applied current/voltage. In extreme examples the conductivity of the device can be dramatically decreased by the applied current/voltage, resulting in non-ohmic behaviour. In other cases, where the coverage is initially insufficient to allow ohmic conduction, the applied current/voltage can create a current carrying state with ohmic or near ohmic conduction. This is in fact found to be the case for samples which have been oxidised by the atmosphere to an essentially insulating state i.e. a current carrying state with ohmic or near ohmic conduction can sometimes be regenerated in such devices.

The foregoing describes the invention. Alterations and modifications as will be obvious to those skilled in the art are intended to be incorporated in the scope hereof.

What we claim is:

1. A method of forming at least a single conducting chain of nanoparticles between a number of contacts on a substrate comprising or including the steps of:
   a. forming contacts separated by a distance smaller than 10 microns on the substrate,
   b. preparing a plurality of nanoparticles, said nanoparticles being composed of two or more atoms of the same or different elements, of uniform or non-uniform size, and subsequently
   c. directing a beam of the nanoparticles towards the substrate to randomly deposit a plurality of said nanoparticles on the substrate at least in the region between the contacts until the particles form at least one chain of nanoparticles between the contacts through which conduction consisting essentially of ohmic conduction can occur.

2. A method as claimed in claim 1 wherein the contacts are separated by a distance less than 1000 nm.

3. A method as claimed in claim 2 wherein the contacts are separated by a distance less than 100 nm.

4. A method as claimed in claim 1 wherein the nanoparticle preparation step is performed via inert gas aggregation.

5. A method as claimed in claim 4 wherein the substrate is an insulating or semiconductor material.

6. A method as claimed in claim 5 wherein the substrate is selected from silicon, silicon nitride, silicon oxide, aluminium oxide, indium tin oxide, germanium, gallium arsenide or any other III-V semiconductor, quartz, or glass.

7. A method as claimed in claim 6 wherein the nanoparticles are selected from bismuth, antimony, aluminium, silicon, germanium, silver, gold, copper, iron, nickel or cobalt clusters.

8. A method as claimed in claim 1 wherein the contacts are formed by lithography.

9. A method as claimed in claim 1 wherein the formation of the at least a single conduction chain is either by:

i. monitoring the conduction between the contacts and ceasing deposition at or near to the onset of conduction, or
   ii. modifying the substrate surface, or taking advantage of pre-existing topographical features, so as to cause the nanoparticles to form a nanowire when deposited in the region of the modification or topographical features.

10. A method as claimed in claim 9 wherein the step of formation of the chain of conducting nanoparticles is step i., and the geometry of the contacts in relation to each other and in relation to nanoparticle size has been optimised so as to increase the likelihood of the formation of a chain of nanoparticles at a surface coverage where conduction would not normally be expected in a macroscopic film or part thereof, of the same particles.

11. A method as claimed in claim 10 wherein the optimisation is via percolation theory calculations, wherein percolation theory defines a percolation threshold, at which such an arrangement or system becomes conducting, and wherein optimisation gives rise to conduction at a surface coverage that is smaller than the percolation threshold.

12. A method as claimed in claim 11 wherein the contacts are spaced apart by between 4-6× the average nanoparticle diameter; and the width of each contact is substantially more than 10 × the contact spacing.

13. A method as claimed in claim 12 wherein the overall geometry of contacts is an interdigitated geometry.

14. A method as claimed in claim 13 wherein the conditions are such to discourage diffusion of the nanoparticles on the substrate surface, including the conditions of temperature, surface smoothness, and/or identity.

15. A method as claimed in claim 9 wherein the formation of the chain of conducting nanoparticles is via step ii.

16. A method as claimed in claim 15 wherein the modification includes formation of a step, depression or ridge in the substrate surface, running substantially between two contacts.

17. A method as claimed in claim 16 wherein the modification comprises formation of a groove having a substantially v-shaped cross-section running substantially between the contacts.

18. A method as claimed in claim 17 wherein the conditions are such to encourage diffusion of the nanoparticles on the substrate surface, including the conditions of temperature, surface smoothness and/or surface type and/or identity.

19. A method as claimed in claim 18 wherein the modification is by lithography, etching, or a combination thereof.

20. A method of forming a conducting nanowire between two contacts on a substrate surface comprising or including the steps of:
   a. forming the contacts separated by a distance smaller than 10 microns on the substrate,
   b. preparing a plurality of nanoparticles, said nanoparticles being composed of two or more atoms of the same or different elements, of uniform or non-uniform size,
   c. directing a beam of the nanoparticles towards the substrate to randomly deposit a plurality of said nanoparticles on the substrate at least in the region between the contacts,
   d. monitoring the formation of the conducting nanowire by monitoring conduction between the two contacts, and ceasing deposition at the onset of conduction comprising predominantly ohmic conduction.

21. A method as claimed in claim 20 wherein the contacts are separated by a distance smaller than 1000 nm.

22. A method as claimed in claim 21 wherein the contacts are separated by a distance smaller than 100 nm.

23. A method as claimed in claim 20 wherein the nanoparticle preparation and deposition steps are via inert gas aggregation and the nanoparticles are atomic clusters made up of two or more atoms, which may or may not be of the same element.

24. A method as claimed in claim 20 wherein the geometry of the contacts has been optimised by percolation theory calculations to provide a conducting nanowire at a surface coverage of nanoparticles on the substrate, in the region between the contacts, of less than the percolation threshold.

25. A method as claimed in claim 24 wherein the surface coverage is substantially in the region of 20%.

26. A method as claimed in claim 24 wherein the optimal geometry requires:
- a rectangular region between the contacts or a geometrically equivalent region such as interdigitated contacts;
- the contacts spaced apart by less than 60× the average nanoparticle diameter, and
- the width of each contact being between more than 10× the contact spacing.

27. A method as claimed in claim 26 wherein:
- the contacts are spaced apart by between 4-6× the average nanoparticle diameter; and
- the length of each contact is substantially more than 10× the contact spacing.

28. A method as claimed in claim 27 wherein the overall geometry of contacts is an interdigitated geometry.

29. A method as claimed in claim 28 wherein the conditions are such to discourage diffusion of the nanoparticles on the substrate surface, including the conditions of temperature, surface smoothness and/or surface type and/or identity.

30. A method as claimed in claim 20 wherein the substrate has a topography in the region between the contacts that promotes the formation of a conducting path of nanoparticles between the contacts.

31. A method as claimed in claim 30 wherein the method includes an additional step before or after step a) or b) but at least before step c) of: modifying the surface to provide topographical assistance to the positioning of the depositing nanoparticles in order to give rise to a conducting pathway.

32. A method as claimed in claim 31 wherein the modification includes formation of a step, depression, ridge or groove in the substrate surface, running substantially between two contacts.

33. A method as claimed in claim 32 wherein the modification is by lithography, etching, or a combination thereof.

34. A method as claimed in claim 33 wherein the conditions are such to encourage diffusion of the nanoparticles on the substrate surface, including the conditions of temperature, surface smoothness and/or surface type and/or identity.

35. A method as claimed in claim 20 wherein the substrate is an insulating or semiconducting material.

36. A method as claimed in claim 35 wherein the substrate is selected from silicon, silicon nitride, silicon oxide, aluminium oxide, indium tin oxide, germanium, gallium arsenide or any other III-V semiconductor, quartz, or glass.

37. A method as claimed in claim 20 wherein the nanoparticles are selected from bismuth, antimony, aluminium, silicon, germanium, silver, gold, copper, iron, nickel or cobalt clusters.

38. A method of forming a conducting nanowire between two contacts on a substrate surface comprising or including the steps of:
a. forming spaced contacts on the substrate,
b. preparing a plurality of nanoparticles, said nanoparticles being composed of two or more atoms of the same or different elements, of uniform or non-uniform size,
c. directing a beam of the nanoparticles towards the substrate to randomly deposit a plurality of said nanoparticles on the substrate in the region between the contacts,
d. achieving a single nanowire running substantially between the two contacts by either:
  i. monitoring the conduction between the contacts, said contacts being separated by a distance smaller than 10 microns, and ceasing deposition at the onset of ohmic conduction, or
  ii. modifying the substrate to achieve, or taking advantage of pre-existing topographical features which will cause the nanoparticles to form the nanowire.

39. A method as claimed in claim 38 wherein the contacts are separated by a distance smaller than 1000 nm.

40. A method as claimed in claim 39 wherein the contacts are separated by a distance smaller than 100 nm.

41. A method as claimed in claim 38 wherein the deposition step includes directing a beam of the nanoparticles towards the substrate to deposit the nanoparticles on the substrate.

42. A method as claimed in claim 41 wherein the nanoparticle preparation and deposition steps are via inert gas aggregation.

43. A method as claimed in claim 42 wherein the contacts are formed by lithography.

44. A method as claimed in claim 43 wherein the substrate is an insulating or semiconducting material.

45. A method as claimed in claim 44 wherein the substrate is selected from silicon, silicon nitride, silicon oxide, aluminium oxide, indium tin oxide, germanium, gallium arsenide or any other III-V semiconductor, quartz, or glass.

46. A method as claimed in claim 42 wherein the nanoparticles are selected from bismuth, antimony, aluminium, silicon, germanium, silver, gold, copper, iron, nickel or cobalt clusters.

47. A method of fabricating a nanoscale device including or requiring a conduction path between two contacts formed on a substrate, including or comprising the steps of:
A. preparing a conducting nanowire between two contacts on a substrate surface as described in any one of claims 1, 20, or 38, and
B. incorporating the contacts and nanowire into the nanoscale device.

48. A method as claimed in claim 47 wherein the device includes two or more contacts and includes one or more of the conducting nanowires.

49. A method as claimed in claim 48 wherein the step of incorporation results in any one or more of the following embodiments:
1. two primary contacts having the conducting nanowire between them, and a least a third contact on the substrate which is not electrically connected to the primary contacts thereby capable of acting as a gate or other element in a amplifying or switching device, transistor or equivalent; and/or
2. two primary contacts having the conducting nanowire between them, an overlayer or underlayer of an insulating material and a least a third contact on the distal side of the overlayer or underlayer from the primary contacts, whereby the third contact is capable of acting as a gate or other element in a switching device, transistor or equivalent; and/or
3. the contacts and/or nanowire are protected by an oxide or other non-metallic or semi-conducting film to protect it and/or enhance its properties; and/or 4. a capping layer (which may or may not be doped) is present over the surface of the substrate with contacts and nanowire, which may or may not be the film of 3;
5. the nanoparticles being annealed on the surface of the substrate;
6. the position of the nanoparticles are controlled by a resist or other organic compound or an oxide or other insulating layer which is applied to the substrate and then processed using lithography to define a region or regions where nanoparticles may take part in electrical conduction between the contacts and another region or regions where the nanoparticles will be insulated from the conducting network.

50. A method as claimed in claim 49 wherein the device is a transistor or other switching device, a film deposition control device, a magnetic field sensor, a chemical sensor, a light emitting or detecting device, or a temperature sensor.

51. A method as claimed in claim 47 wherein the device is a deposition sensor monitoring deposition of a nanoparticle film, and includes at least a pair of contacts with an optimised geometry such that the onset of conduction in the device occurs at a surface coverage where conduction would not normally be expected in a macroscopic film of the same particles, wherein the contact spacing can be selected so as to vary the surface coverage at, or near, the onset of conduction and wherein as a result of the predefined contact spacing the onset of conduction in the nanoparticle film is used to sense when a pre-determined coverage of nanoparticles in the film has been achieved.

52. A method as claimed in claim 51 wherein the device is a deposition sensor and the nanoparticles are coated in ligands or an insulating layer such that the onset of tunnelling conduction is used to monitor the film thickness.

53. A device as claimed in claim 49 wherein conduction through the chain is initiated by an applied voltage or current, either during or subsequent to the deposition of the particles.

* * * * *